United States Patent
McQuaide et al.

(10) Patent No.: US 12,502,690 B2
(45) Date of Patent: Dec. 23, 2025

(54) TRANSDUCER SYSTEM AND METHOD

(71) Applicant: Emerge Now Inc., Marina del Rey, CA (US)

(72) Inventors: Sarah McQuaide, Marina del Rey, CA (US); Adam Elhadad, Marina del Rey, CA (US); James D. Hamilton, Marina del Rey, CA (US); Dragan Maric, Marina del Rey, CA (US); Carolyn Bianco, Marina del Rey, CA (US); Leland J. Spangler, Marina del Rey, CA (US)

(73) Assignee: Emerge Now Inc., Marina del Rey, CA (US)

( * ) Notice: Subject to any disclaimer, the term of this patent is extended or adjusted under 35 U.S.C. 154(b) by 0 days.

(21) Appl. No.: 19/096,985

(22) Filed: Apr. 1, 2025

(65) Prior Publication Data
US 2025/0303445 A1    Oct. 2, 2025

Related U.S. Application Data

(60) Provisional application No. 63/572,796, filed on Apr. 1, 2024, provisional application No. 63/694,123, filed on Sep. 12, 2024.

(51) Int. Cl.
*H01L 41/053* (2006.01)
*B06B 1/06* (2006.01)
*H10N 30/088* (2023.01)

(52) U.S. Cl.
CPC ......... *B06B 1/0603* (2013.01); *H10N 30/088* (2023.02)

(58) Field of Classification Search
CPC .................. B06B 1/0603; B06B 1/06
See application file for complete search history.

(56) References Cited

U.S. PATENT DOCUMENTS

| | | | |
|---|---|---|---|
| 2007/0169553 A1* | 7/2007 | Mutharasan | G01H 13/00 73/579 |
| 2008/0013405 A1 | 1/2008 | Moon et al. | |
| 2008/0074002 A1* | 3/2008 | Priya | H10N 30/306 310/339 |
| 2009/0160763 A1* | 6/2009 | Cauwels | G06F 3/016 345/156 |
| 2012/0250909 A1* | 10/2012 | Grosh | H10N 30/05 381/174 |
| 2012/0266675 A1* | 10/2012 | Huffman | B06B 1/0622 73/632 |

(Continued)

OTHER PUBLICATIONS

Abdul, et al., "Design, fabrication and characterization of piezoelectric cantilever MEMS for underwater application", Micro and Nano Engineering 7 (2020) 100050.

(Continued)

*Primary Examiner* — Bryan P Gordon
(74) *Attorney, Agent, or Firm* — Jeffrey Schox; Diana Lin

(57) ABSTRACT

The system can include one or more transducers, wherein a transducer can include a set of cantilevers and a set of support components. The system can optionally include a processing system and/or any other suitable components. In variants, the system can function as an ultrasonic emitter (e.g., to provide gloves-free tactile sensation for augmented reality and/or virtual reality haptics systems) and/or as a sensor.

12 Claims, 32 Drawing Sheets

(56) References Cited

U.S. PATENT DOCUMENTS

| | | | |
|---|---|---|---|
| 2015/0097468 A1* | 4/2015 | Hajati | H10N 30/101 |
| | | | 310/334 |
| 2017/0021391 A1* | 1/2017 | Guedes | B06B 1/0603 |
| 2017/0320093 A1 | 11/2017 | Chatterjee et al. | |
| 2019/0268693 A1 | 8/2019 | Verbeke et al. | |
| 2021/0078042 A1* | 3/2021 | Bircumshaw | B06B 1/0662 |
| 2021/0286434 A1 | 9/2021 | Brummel et al. | |
| 2023/0011826 A1 | 1/2023 | Yee et al. | |

OTHER PUBLICATIONS

Arya, et al., "Design and fabrication of MEMS based electrostatic cantilever as ultrasonic signal generator", Microelectronic Engineering 154 (2016) 74-79.

* cited by examiner

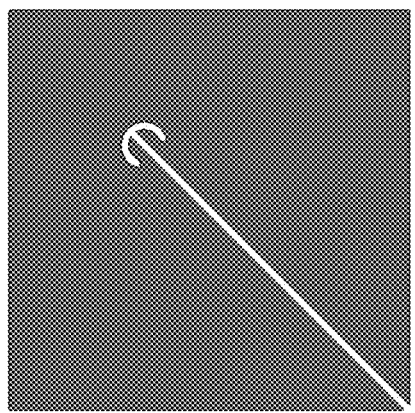 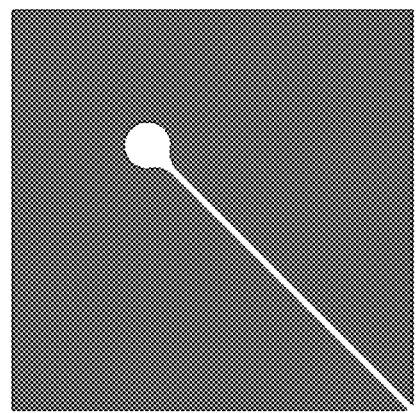
FIGURE 9A                    FIGURE 9B

Piezoelectric layer
Passive layer

Unimorph
Movement: upward only

Piezoelectric layers
Passive layer

Bimorph example 1
Movement: upward only

Piezoelectric layer
Passive layer
Piezoelectric layer

Bimorph example 2
Movement: upward and downward

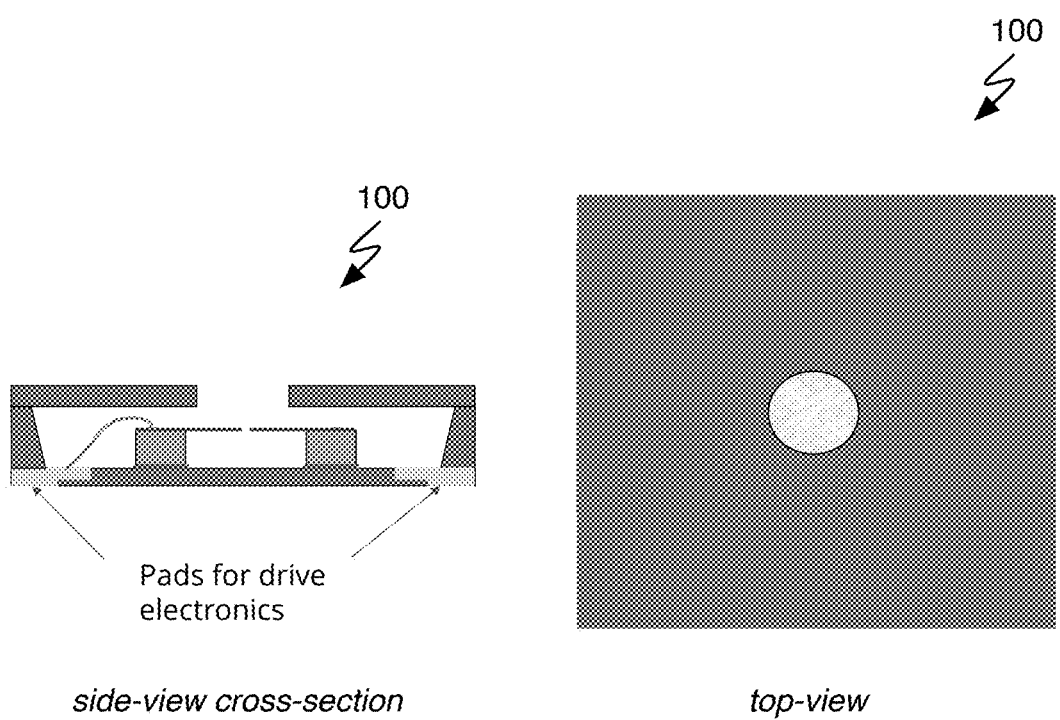
side-view cross-section                top-view
FIGURE 18A                             FIGURE 18B

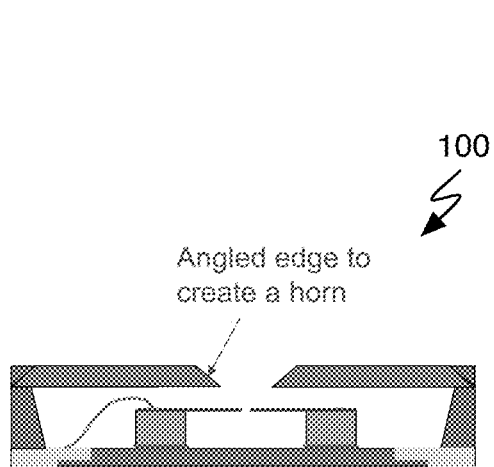
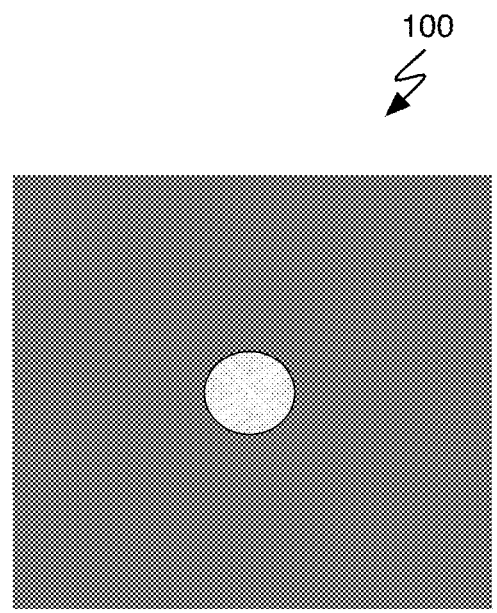
side-view cross-section
top-view
FIGURE 19A
FIGURE 19B

*side-view cross-section*

*top-view*

TRANSDUCER SYSTEM AND METHOD

CROSS-REFERENCE TO RELATED APPLICATIONS

This application claims the benefit of U.S. Provisional Application No. 63/694,120 filed 12 Sep. 2024, and U.S. Provisional Application No. 63/572,796 filed 1 Apr. 2024, each of which is incorporated in its entirety by this reference.

TECHNICAL FIELD

This invention relates generally to the micro-electromechanical systems field, and more specifically to a new and useful system and method in the micro-electromechanical systems field.

BRIEF DESCRIPTION OF THE FIGURES

FIGS. 9A and 9B depict example slit endpoints.

FIGS. 18A and 18B depict a first example of device packaging, including a straight opening in the packaging cover.

FIGS. 19A and 19B depict a first example of device packaging, including an angled opening in the packaging cover.

DETAILED DESCRIPTION

The following description of the embodiments of the invention is not intended to limit the invention to these embodiments, but rather to enable any person skilled in the art to make and use this invention.

1. OVERVIEW

Figure 1:
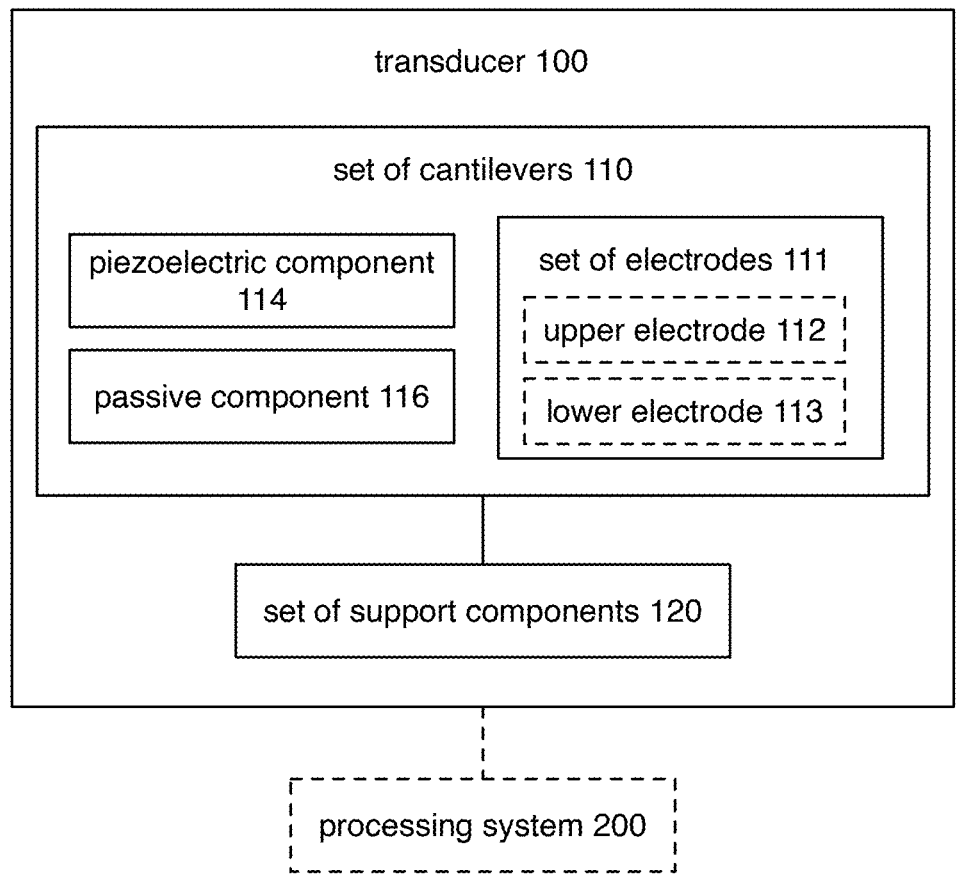
FIG. 1 is a schematic representation of a variant of the system.

As shown in FIG. 1, the system can include one or more transducers 100. A transducer 100 can include a set of cantilevers 110 and a set of support components 120. However, the system can additionally or alternatively include any other suitable components.

In variants, the system can function as an ultrasonic emitter. For example, the system can function to provide gloves-free tactile sensation for augmented reality and/or virtual reality haptics systems. Additionally or alternatively, the system can function as a sensor (e.g., a microphone, a computer vision sensing system, an imaging array, a gesture sensor, a proximity sensor, etc.).

2. EXAMPLES

In an example, the system includes one or more microelectromechanical systems (MEMS) transducers. In a specific example, an array of the transducers can be used for mid-air ultrasonic stimulation. Each transducer can include a set of cantilevers (e.g., four cantilevers) formed by creating slits through a piezoelectric thin film stack. In a specific example, each cantilever can include the following layers: an upper electrode, a piezoelectric component, a lower electrode, and a passive component (e.g., silicon). The upper and lower electrodes can provide an electric field across the piezoelectric component, causing the piezoelectric component to lengthen and/or shorten. The cantilever 'bends' (e.g., deflects upwards or downwards) as the piezoelectric component changes in length (e.g., because the piezoelectric component is coupled to the passive component), creating an actuator. The cantilever can optionally be designed to have a resonance frequency at a desired ultrasonic frequency (e.g., approximately 96 kHz). In an example, driving the cantilevers at the resonant frequency can create deflection at that frequency, which in turn can produce acoustic waves.

3. TECHNICAL ADVANTAGES

Variants of the technology can confer one or more advantages over conventional technologies.

First, conventional bulk ceramic piezoelectric transducers are expensive, difficult to integrate, and do not have optimized acoustic and electric capabilities for mid-air haptics (e.g., mid-air ultrasonic stimulation) use cases. The inventors have developed a new ultrasound emitter based on micro-electromechanical systems (MEMS) technology to reduce cost, improve manufacturing scalability, and improve acoustic characteristics for mid-air haptics compared to conventional bulk transducers. In a first specific example, the increased actuation frequency of the MEMS transducer relative to bulk transducers provides improved spatial resolution of tactile generation. In a second specific example, operating the MEMS transducer at resonance can increase the power of the acoustic waves output by the transducer. In an illustrative example, a single MEMS transducer can output acoustic waves at 20 Pascals of pressure at a 20 cm range.

Second, variants of the technology can include a set of cantilevers formed by creating slits through a piezoelectric thin film stack supported over a back cavity. The slits can optionally partially extend across the back cavity (e.g., less than 75% across the diagonal of the back cavity). In variants, these partial slits can increase in-phase motion of the set of cantilevers relative to full-length slits, which can increase the overall acoustic power efficiency. Additionally or alternatively, these partial slits can create elastic coupling between the set of cantilevers, allowing for stronger overall resonance behavior and increased acoustic output. Additionally or alternatively, these partial slits can reduce fluid (e.g., air) flow into and out of the back cavity (e.g., resulting in greater pressure output versus drive voltage relative to full length slits).

However, further advantages can be provided by the system and method disclosed herein.

4. SYSTEM

As shown in FIG. 1, the system can include one or more transducers 100, wherein a transducer 100 can include a set of cantilevers 110 and a set of support components 120. The system can optionally include a processing system 200 and/or any other suitable components.

The system can optionally include or interface with any or all of the systems and methods described in any or all of: U.S. application Ser. No. 17/331,345, filed 26 May 2021; U.S. application Ser. No. 18/378,782, filed 11 Oct. 2023; U.S. application Ser. No. 18/779,660, filed 22 Jul. 2024; U.S. application Ser. No. 18/758,780, filed 28 Jun. 2024; U.S. application Ser. No. 17/943,418, filed 13 Sep. 2022; and U.S. application Ser. No. 18/416,824, filed 18 Jan. 2024, each of which is incorporated herein in its entirety by this reference.

As used herein, the base of the transducer is parallel to the xy-plane. In a specific example, when a cantilever is not in a flexed state, the neutral axis of the cantilever is parallel to the xy-plane. However, the xyz coordinate system as used herein is intended only for reference and is not intended to restrict the orientation of system elements relative to a global coordinate system. System components can be arranged in any orientation (e.g., where the x-axis corresponds to a vertical axis, where the y-axis corresponds to a vertical axis, where the z-axis corresponds to a vertical orientation, etc.).

The transducer 100 can function to generate acoustic waves. The acoustic waves are preferably generated in air (e.g., for mid-air haptics), but can additionally or alternatively be generated in any other fluid. The transducer 100 can additionally or alternatively function as a sensor. The transducer 100 can optionally be part of a set of transducers (e.g., an array of transducers). In an example, the number of transducers in the set of transducers can be between 1-10,000 or any range or value therebetween (e.g., 100-1000, 400-800, at least 100, at least 200, at least 400, etc.). Each transducer 100 in the set of transducers can optionally be independently actuated (e.g., as controlled by the processing system 200). The transducers 100 in the set of transducers are preferably actuated at the same frequency (e.g., at a target frequency), but can alternatively be actuated at different frequencies. In a specific example, a transducer can output acoustic waves at a pressure between 5-100 Pascals of pressure (e.g., at a 20 cm range) or any range or value therebetween (e.g., 15-25 Pascals, at least 10 Pascals, at least 15 Pascals, at least 20 Pascals, etc.).

Transducers 100 in the set of transducers can optionally be electrically connected to one another (e.g., a set of electrodes 111 in a first transducer 100 are connected to a set of electrodes 111 in a second transducer 100). In a specific example, the system can include a phased array of transducers 100. In a first example, transducers 100 in a set of transducers (e.g., electrically connected transducers) can operate in phase with one another (e.g., synchronously). In a specific example, this can effectively create a larger, more powerful transducer. In a second example, transducers 100 in a set of transducers (e.g., a phased array) can be operated out of phase. In a specific example, the transducers 100 can be operated with different phases to beamform (e.g. phase proportional to time-of-flight to focus/tactile location).

The transducer 100 can be a micro-electromechanical system (MEMS) transducer configured to actuate at one or more target frequencies (e.g., within a target frequency band). The target frequency is preferably an ultrasonic frequency, but can additionally or alternatively be any other frequency. In an example, the target frequency can be between 20 kHz-1000 kHz or any range or value therebetween (e.g., greater than 50 kHz, 50 kHz-100 kHz, 75 kHz-150 kHz, 90 kHz-110 kHz, approximately 96 kHz, etc.). In an example, the width of the target frequency band is less than 10 kHz (e.g., less than 5 kHz, less than 1 kHz, less than 0.5 kHz, less than 0.1 kHz). The transducer 100 preferably actuates at or near the resonance frequency of the transducer 100 (e.g., within 10 kHz of the resonance frequency, within 5 kHz of the resonance frequency, within 1 kHz of the resonance frequency, etc.), but can alternatively actuate off-resonance. In variants, operating at resonance can increase the energy of the acoustic waves output by the transducer 100. Transducers 100 in the set of transducers preferably actuate at the same frequency as one another, but can alternatively actuate at different frequencies.

In an example, the height (e.g., in the z-direction) of the transducer 100 can be between 0.2 mm-10 mm or any range or value therebetween (e.g., approximately 1 mm, less than 10 mm, less than 5 mm, less than 2 mm, etc.). In an example, the surface area of the transducer 100 (e.g., in the xy-plane) can be between 1 $mm^2$-100 $mm^2$ or any range or value therebetween (e.g., 1 $mm^2$-5 $mm^2$, approximately 2 $mm^2$, less than 10 $mm^2$, less than 5 $mm^2$, etc.). In an example, the power used by an individual transducer 100 can be between 5 W-100 W or any range or value therebetween (e.g., less than 75 W, less than 50 W, less than 30 W, approximately 21 W, etc.).

In an example, the interaction volume (for mid-air haptics) over a set of transducers can fall between −80° to +80° relative to a central axis over the set of transducers, or any range or value therebetween (e.g., at least ±40°, at least ±50°, at least ∓60°, etc.). In an example, the height range of the interaction volume can be between 0-1000 cm or any range or value therebetween (e.g., 1 cm-100 cm, 5 cm-30 cm, etc.). In an example, the tactile resolution of a set of transducers at a given range (e.g., at a 20 cm range) can be between 1 mm-10 mm or any range or value therebetween (e.g., 4 mm, less than 10 mm, less than 8 mm, less than 6 mm, less than 5 mm, etc.). Examples of a simulated pressure field from a set of transducers in the plane above and parallel to the set of transducers are shown in FIGS. 12A-12D.

The transducer 100 can include a set of cantilevers 110 and a set of support components 120. Specific examples of transducers 100 and/or MEMS die designs for transducers 100 are shown in FIG. 5A, FIG. 5B, FIG. 6A, FIG. 6B, FIG. 7, FIGS. 8A-8D, FIG. 13, FIG. 18, FIG. 19, FIG. 20, and FIGS. 21A-21K.

The set of cantilevers 110 can function to flex in response to applied voltage, creating an actuator. For example, applied voltage to the set of electrodes 111 of a cantilever causes the piezoelectric component 114 of the cantilever to lengthen and/or shorten, which in turn causes the cantilever to bend because the piezoelectric component is coupled to a passive component 116. Each cantilever can be connected to: the processing system 200, the set of support components 120, one or more other cantilevers in the set of cantilevers 110, and/or any other suitable components.

The set of cantilevers 110 can optionally be configured to have a resonance frequency at the target frequency of the transducer 100. In a specific example, driving the set of cantilevers 110 (e.g., applying a voltage pattern) at the resonant frequency creates deflection of the set of cantilevers 110 at that resonance frequency, which in turn produces acoustic waves. The number of cantilevers in the set of cantilevers 110 can be between 1-50 or any range or value therebetween (e.g., 2-6, 4, at least 2, at least 4, etc.), but can alternatively be greater than 50.

The shape of a cantilever and/or the shape formed by the footprint (e.g., boundary) of the cantilever (e.g., in the xy plane) can be a triangle, rounded triangle, sector (e.g., a circular sector, an elliptical sector, etc.), segment, rectangle, rounded rectangle, trapezoid, rounded trapezoid, an elliptical sector, with a combination thereof (e.g., a triangle and a segment), and/or any other suitable shape. In an example, the shape of the footprint (e.g., boundary) of the cantilever (e.g., in the xy plane) at the cantilever root can be a sector of an ellipse (e.g., an elliptical sector). In a specific example, the midpoint of the arc of the elliptical sector is coincident with a co-vertex of the ellipse. In another example, the shape of the footprint of the cantilever (e.g., in the xy plane) at the cantilever root can be a sector of a circle (e.g. a circular sector). In a specific example, the radius of the circular sector can be greater than the cantilever's side length.

Components (e.g., edges, sides, points, etc.) of a cantilever can include a root (e.g., statically coupled to a support component of the set of support components 120), a tip (e.g., an unsupported end of the cantilever, opposite the root), and sides (e.g., free edges). The tip can be curved (e.g., a curved edge), straight (e.g., a straight edge), and/or point. In a specific example, in the case of a triangular cantilever, the tip can be a point. The root of the cantilever (e.g., an edge in the xy plane defining a boundary of the root) is preferably curved (e.g., an arc), but can alternatively be straight. In a specific example, the radius of a circle formed by the arc can be between 200 μm-2000 μm or any range or value therebetween (e.g., 500 μm-1000 μm, 700 μm-900 μm, 800 μm-850 μm, etc.). In an example, each cantilever can be coupled to an adjacent cantilever in the set of cantilevers 110 along a portion of a side of the cantilever (e.g., a cantilever side can optionally be partially coupled to a side of an adjacent cantilever). In a specific example, a cantilever can have two sides, wherein the first side is partially coupled to a side of a first adjacent cantilever and the second side is partially coupled to a second adjacent cantilever. For example, a side of the cantilever can include a free portion (uncoupled to an adjacent cantilever and unsupported by the set of support components 120) and a coupled portion (coupled to an adjacent cantilever and unsupported by the set of support components 120). In an illustrative example, a portion of the right side of a first cantilever can be coupled to a corresponding portion of the left side of a second cantilever. In an example, the overall length of the side can be between 100 μm and 10,000 μm or any range or value therebetween (e.g., 500 μm-2000 μm). In an example, the side of a cantilever can be completely uncoupled from an adjacent cantilever (e.g., the coupled portion is 0% of the side). In another example, the coupled portion of the side of a cantilever can be between 0%-75% of the side or any range or value therebetween (e.g., 0%-50%, 10%-75%, etc.). In a specific example, the coupled portion of a side of a cantilever can be at least 5% of the side (e.g., at least 10%, at least 15%, at least 20%, at least 25%, at least 30%, at least 50%, etc.). In an example, the coupled portion of a side of a cantilever can be at least 10 μm in length (e.g., at least 10 μm, at least 25 μm, at least 50 μm, at least 100 μm, at least 150 μm, at least 200 μm, at least 300 μm, at least 400 μm, etc.). The length of the coupled portion of the side is preferably less than the length of the free portion of the side, but can alternatively be greater than the length of the free portion of the side.

Figure 2A:
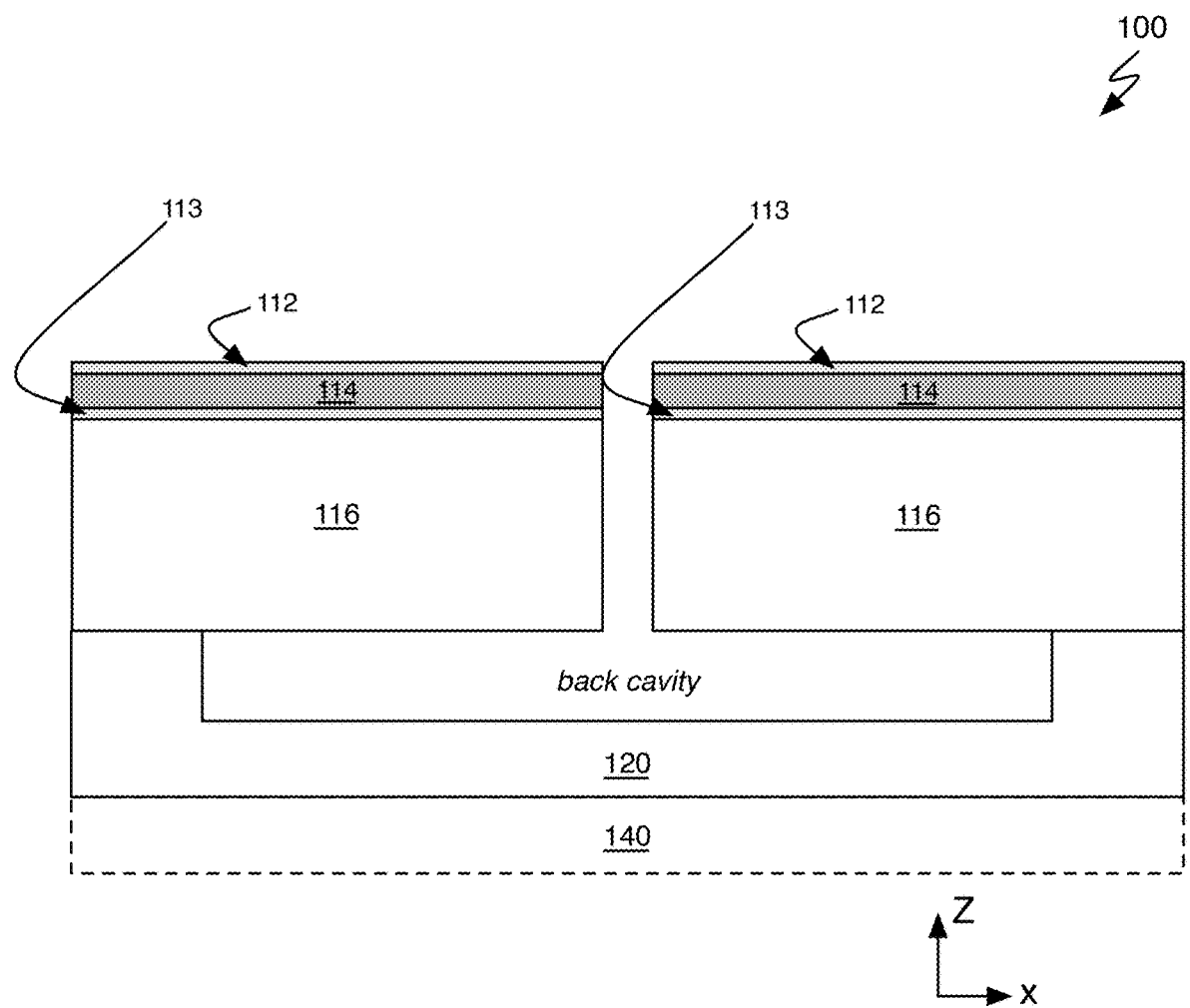
FIG. 2A depicts an example of a transducer with a "closed" back cavity.
Figure 2B:
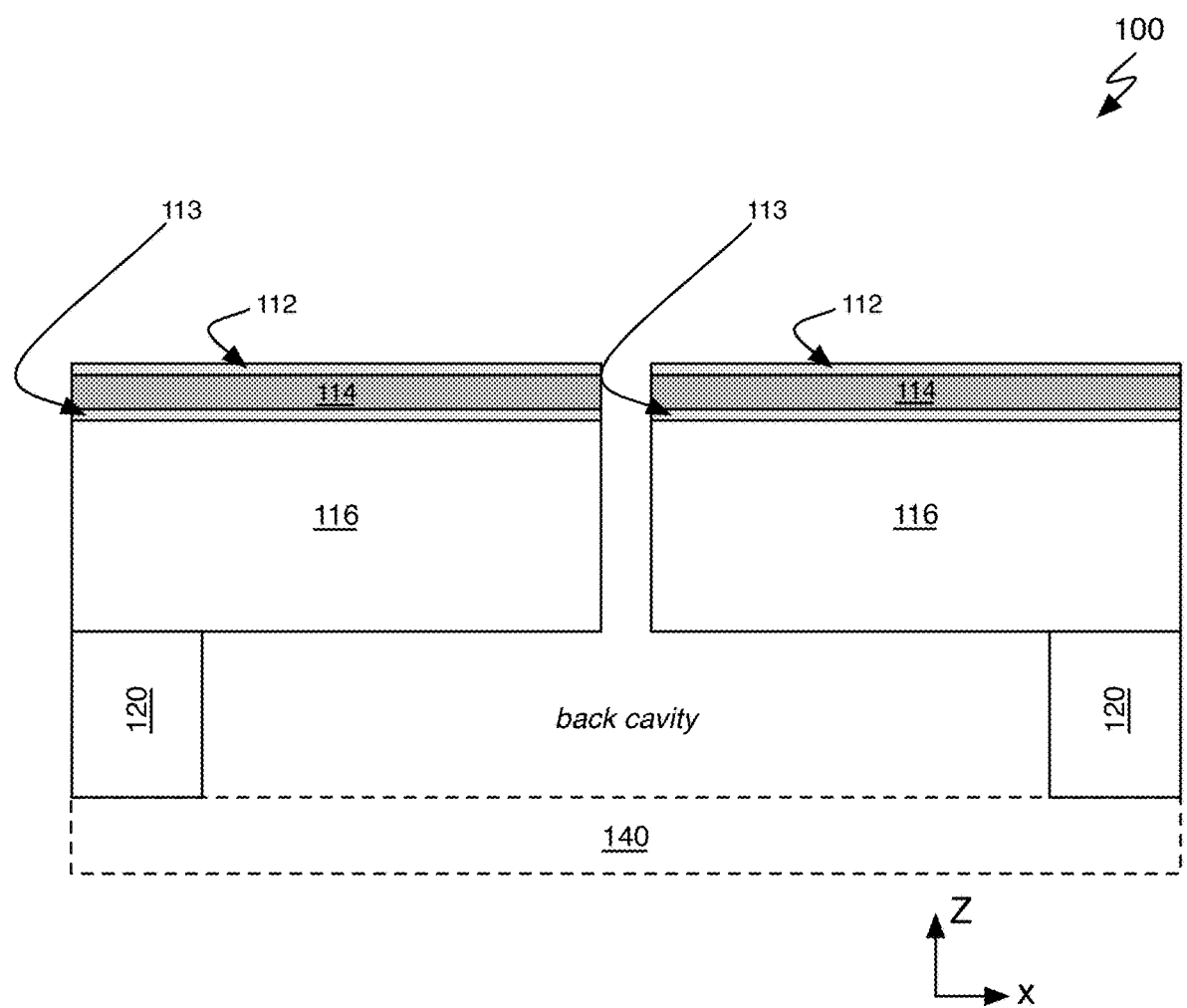
FIG. 2B depicts an example of a transducer with an "open" back cavity.

Each cantilever in the set of cantilevers 110 can include: a set of electrodes 111 (e.g., including an upper electrode 112 and a lower electrode 113), a piezoelectric component 114, and a passive component 116. The cantilever can be supported at one end (e.g., at the cantilever root) by the set of support components 120. The unsupported portion of the cantilever can be positioned above a back cavity (e.g., a cavity) of the transducer 100. In a specific example, the underside of a cantilever (e.g., the underside of the passive component 116) defines the roof of the back cavity. In an illustrative example, when a transducer 100 includes multiple cantilevers in the set of cantilevers 110, the roof of the back cavity can include openings (e.g., slits used to separate the cantilevers). In another specific example, the set of support components 120 define the sides and/or floor of the back cavity. In an illustrative example, the set of support components 120 can include an upper portion (e.g., supporting the roots of the set of cantilevers 110 and defining the boundary of the back cavity) and a lower portion (e.g., defining the floor of the back cavity). In a specific example, the upper portion of the set of support components 120 can extend (e.g., in the xy plane) from a perimeter of a material stack (e.g., as described below) to the boundary (e.g., side walls) of the back cavity. In an example, the cantilever flexes into and/or out of the back cavity. Examples are shown in FIG. 2A and FIG. 2B. In an example, the maximum deflection (in the z-direction) of the tip of the cantilever can be between 5 µm-500 µm or any range or value therebetween (e.g., approximately 20 µm, approximately 50 µm, approximately 100 µm, approximately 1500 µm, at least 10 µm, at least 20 µm, at least 50 µm, at least 100 µm, etc.).

The set of electrodes 111 functions to provide an electric field across the piezoelectric component 114. In an example, the set of electrodes 111 includes an upper electrode 112 (e.g., positioned above the piezoelectric component 114) and a lower electrode 113 (e.g., positioned below the piezoelectric component 114). The upper electrode 112 can optionally have a different geometry than the lower electrode 113. In a specific example, the lower electrode 113 can be thicker (e.g., at least 10 nm thicker, at least 20 nm thicker, etc.) than the upper electrode 112 (e.g., in the z-direction). In another specific example, the width of the lower electrode 113 can be greater (e.g., at least 5 nm wider, at least 10 nm wider, etc.) than the width of the upper electrode 112 (e.g., at a cross section of the cantilever in the x-direction and/or in the y-direction). The material of the set of electrodes 111 can include platinum, tin, a combination thereof, and/or any other conductive material. In a specific example, the material of the lower electrode 113 can be a different material than the upper electrode 112 (e.g., the lower electrode 113 can be a combination of tin and platinum, and the upper electrode 112 can be platinum). In an example, the thickness of the set of electrodes 111 can be between 20 nm-1,000 nm or any range or value therebetween (e.g., at least 20 nm, at least 50 nm, at least 100 nm, less than 500 nm, less than 200 nm, 100 nm-130 nm, etc.).

In an example, each upper electrode 112 in the set of electrodes 111 of a cantilever can be electrically connected. In another example, each lower electrode 113 in the set of electrodes 111 of a cantilever can be electrically connected. The set of electrodes 111 can optionally include and/or be connected to one or more bond pads. In a first specific example, each upper electrode 112 in the set of electrodes 111 is connected to a corresponding bond pad (e.g., one bond pad for each upper electrode 112). In a second specific example, each upper electrode 112 in the set of electrodes 111 is connected to the same bond pad (e.g., one bond pad for all upper electrodes of the transducer 100). In a third specific example, each lower electrode 113 in the set of electrodes 111 is connected to a corresponding bond pad (e.g., one bond pad for each lower electrode 113). In a fourth specific example, each lower electrode 113 in the set of electrodes 111 is connected to the same bond pad (e.g., one bond pad for all lower electrodes of the transducer 100). Bond pads can optionally be electrically connected (e.g., bond pads corresponding to the upper electrodes can be electrically connected; bond pads corresponding to the lower electrodes can be electrically connected; etc.).

However, the set of electrodes 111 can be otherwise configured.

The piezoelectric component 114 functions to drive the deflection of the set of cantilevers 110 by lengthening and/or shortening in response to applied voltage at the set of electrodes 111. The material of the piezoelectric component 114 can be lead zirconate titanate, barium titanate, lead titanate, and/or any other piezoelectric material. In an example, the thickness of the piezoelectric component 114 can be between 100 nm-10 µm or any range or value therebetween (e.g., 1000 nm-5000 nm, approximately 2000 nm, etc.). In a first variant, the piezoelectric component 114 can be manufactured in the set of cantilevers 110 using thin film deposition (e.g., followed by patterning). In a first example, the material of the piezoelectric component 114 can be spun on a wafer, and then annealed (e.g., heated). In a second example, plasma laser deposition can be used. In a second variant, the piezoelectric component 114 can be manufactured by generating bulk piezoelectric material, and then assembling the bulk piezoelectric material with one or more other components of the set of cantilevers 110.

The piezoelectric component 114 can include one or more piezoelectric layers coupled to (e.g., adhered to) the set of electrodes 111 (e.g., the upper electrode 112 and the lower electrode 113) and/or any other suitable components. For example, a first adhesive component (e.g., an upper adhesive layer) can couple the piezoelectric component 114 (e.g., one or more piezoelectric layers in the piezoelectric component 114) to the upper electrode 112 and a second adhesive component (e.g., a lower adhesive layer) can couple the piezoelectric component 114 to the lower electrode 113. In an example, the thickness of the adhesive component can be between 5 nm-1000 nm or any range or value therebetween (e.g., approximately 20 nm, approximately 100 nm, etc.). In a specific example, the first (upper) adhesive component can be thinner than the second (lower) adhesive component.

Figure 14A:
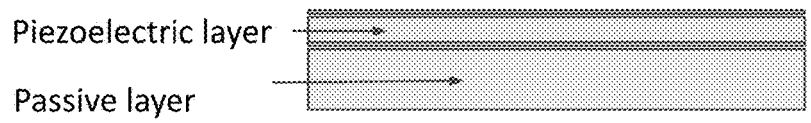
FIG. 14A depicts an example of a cantilever that includes a piezoelectric unimorph (e.g., with deformation only in the upward direction).
Figure 14B:
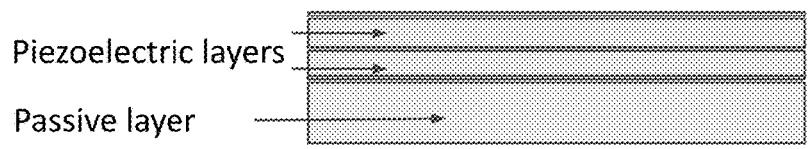
FIG. 14B depicts a first example of a cantilever that includes a piezoelectric bimorph (e.g., with deformation only in the upward direction).
Figure 14C:
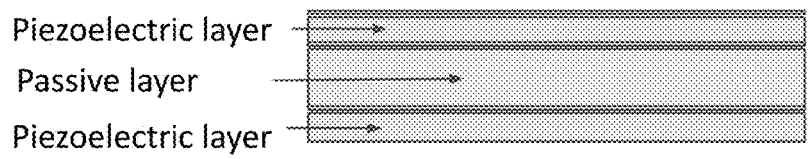
FIG. 14C depicts a second example of a cantilever that includes a piezoelectric bimorph (e.g., with deformation in the upward and downward directions).

In a first variant, the piezoelectric component 114 includes a piezoelectric unimorph, with a single piezoelectric layer (e.g., a single layer of piezoelectric material). An example is shown in FIG. 14A. In an example, using a piezoelectric unimorph can result in precise control of deformation in a single direction (e.g., in the positive z-direction). In a second variant, the piezoelectric component 114 includes a piezoelectric bimorph, with two piezoelectric layers. In a first embodiment, the passive component 116 is positioned between the two piezoelectric layers (e.g., an example shown in FIG. 14C). For example, a cantilever containing this piezoelectric bimorph embodiment can bend in two directions (e.g., the positive and negative z-directions). In a specific example, the cantilever can bend in the positive z-direction when the top piezoelectric layer contracts and/or the bottom piezoelectric layer lengthens; the cantilever can bend in the negative z-direction when the bottom piezoelectric layer contracts and/or the top piezoelectric layer lengthens. In a second embodiment, the two piezoelectric layers can be coupled (e.g., adhered) together, with the passive component 116 positioned on one side of both piezoelectric layers. In a specific example, the passive component 116 can be positioned beneath both piezoelectric layers (e.g., an example is shown in FIG. 14B). For example, a cantilever containing this piezoelectric bimorph embodiment can bend in one direction (e.g., the positive z-direction). In a specific example, a piezoelectric bimorph can exhibit an increased displacement relative to an otherwise equivalent unimorph.

The piezoelectric component 114 can optionally not extend to the tip of the cantilever (e.g., to the slit). For example, a portion of the piezoelectric component 114 can be removed at the tip of the cantilever and/or at one or more boundaries (e.g., edges, perimeter, etc.) of one or more slits. In an example, the distance between the tip (e.g., the slit boundary defining the tip) and the start of the piezoelectric component 114 can be between 0-500 μm or any range or value therebetween (e.g., at least 1 μm, at least 5 μm, at least 10 μm, etc.).

Figure 15A:
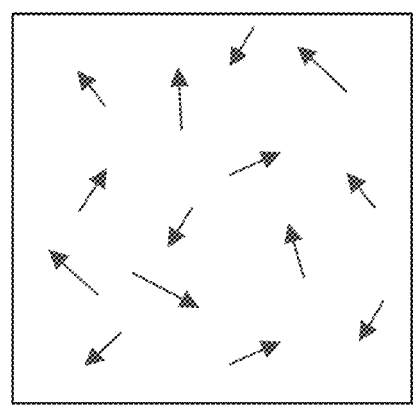
FIG. 15A depicts an example of an unpoled piezoelectric component.
Figure 15B:
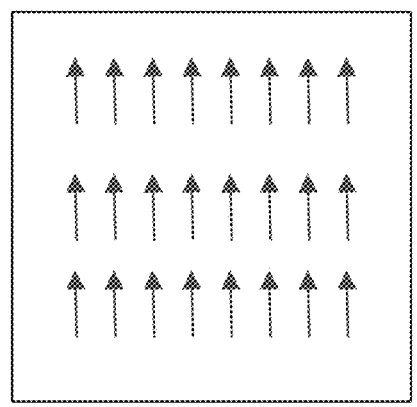
FIG. 15B depicts an example of a poled piezoelectric component.
Figure 16:
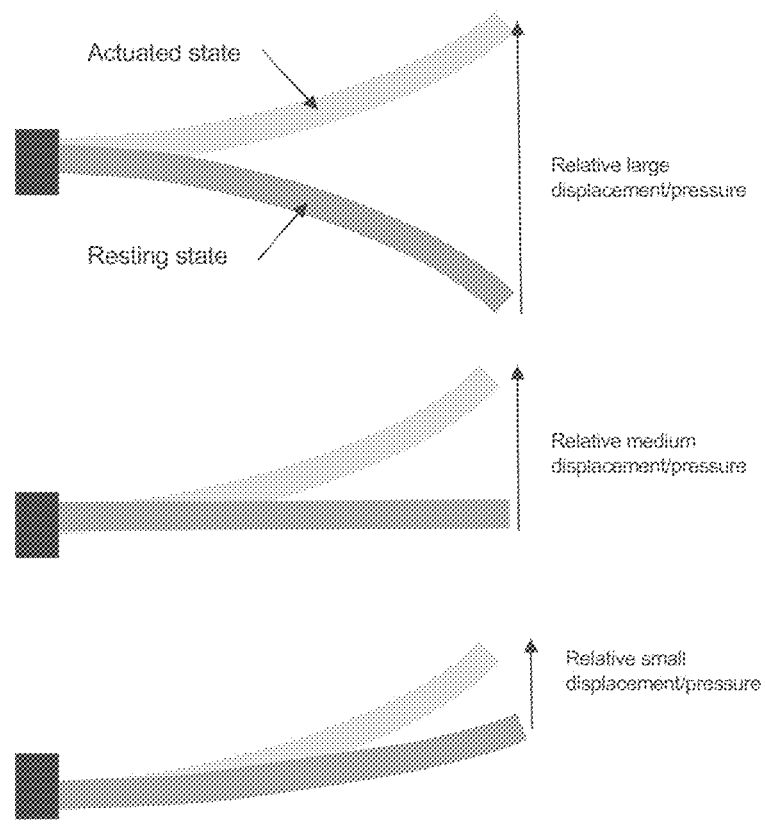
FIG. 16 depicts an example of increasing total displacement (and thus actuation pressure) by tuning the residual stress resting state.
Figure 17:
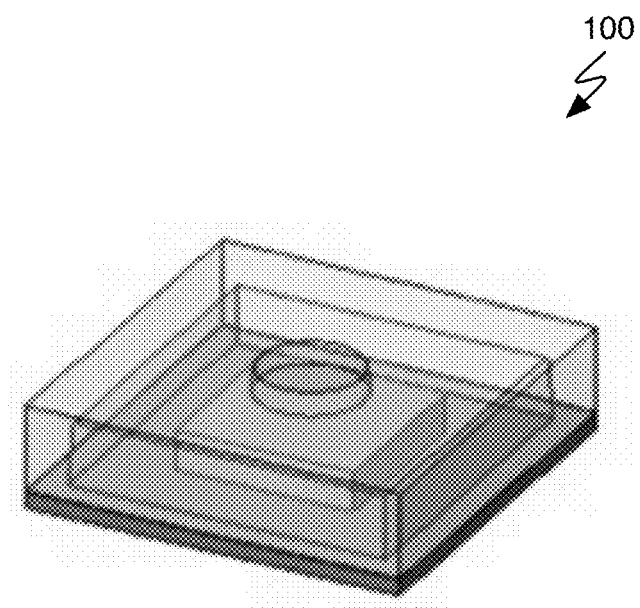
FIG. 17 depicts an example of device packaging (e.g., placing the MEMS die for a set of transducers in a covered package)
Figure 20A:
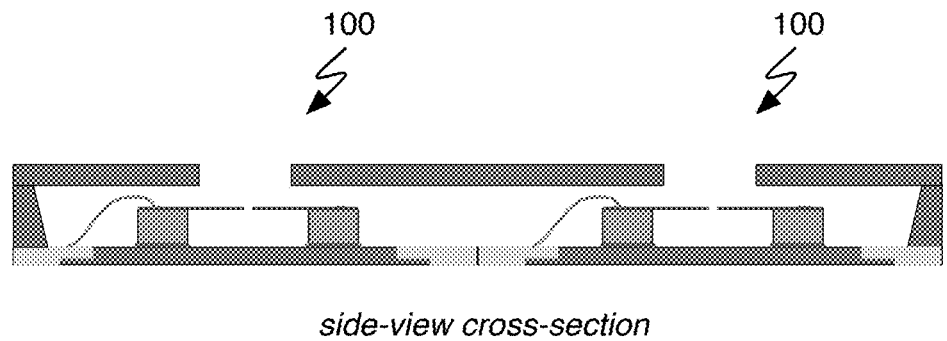
FIGS. 20A and 20B depict a second example of device packaging.
Figure 20B:
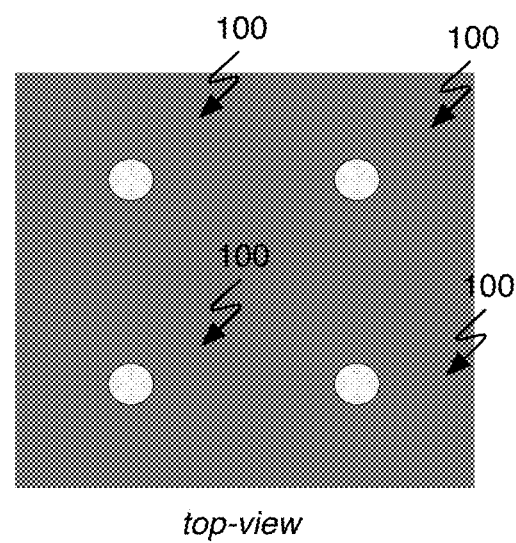

In a first embodiment, the piezoelectric component 114 can be unpoled. An example of an unpoled piezoelectric component 114 (e.g., an unpoled crystal) is shown in FIG. 15A. In a second embodiment, the piezoelectric component 114 can be partially or completely poled. An example of a poled piezoelectric component 114 (e.g., a poled crystal) is shown in FIG. 15B. Poling the piezoelectric component 114 can include placing the piezoelectric component 114 under an electric field (e.g., a constant electric field) for a period of time in order to partially or fully align the dipole moments (e.g., wherein fully aligning the dipole moments included every dipole moment pointing in the same direction). Additionally or alternatively, the piezoelectric component 114 can be partially or completely poled upon deposition. The direction of poling can be parallel to the x-axis (e.g., parallel to the neutral axis of the cantilever), parallel to the y-axis, parallel to the z-axis, and/or any other direction. In an example, the degree of polarization of the piezoelectric component 114 can be between 0%-100% or any range or value therebetween (e.g., at least 10%, at least 25%, at least 50%, at least 75%, etc.). The temperature of the piezoelectric component 114 during poling can optionally change the degree of poling. In variants, poling the piezoelectric component 114 can enhance the actuation performance of the cantilever. For example, poling the piezoelectric component 114 can result in an increased actuation displacement and/or a larger actuation force (e.g., as a result of the increased actuation displacement) relative to an unpoled piezoelectric component 114.

However, the piezoelectric component 114 can be otherwise configured.

The passive component 116 functions to form a passive layer in the set of cantilevers 110. For example, the passive component 116 can function to form a base layer of the set of cantilevers 110. The material of the passive component 116 can be silicon and/or any other passive material. In an example, the thickness of the passive component 116 can be between 100 nm-100 μm or any range or value therebetween (e.g., approximately 10,000 nm, etc.). The passive component 116 can be coupled to (e.g., adhered to) the set of electrodes 111 and/or any other suitable components. For example, a coupling component can couple the passive component 116 to the lower electrode 113 and/or function as an etch stop during manufacturing. In a specific example, the coupling component can be an oxide (e.g., $SiO_2$). In an example, the thickness of the coupling component can be between 100 nm-100 μm or any range or value therebetween (e.g., approximately 1000 nm, etc.).

However, the passive component 116 can be otherwise configured.

The set of cantilevers 110 can optionally include an insulating film, which can function to insulate one or more components of the set of cantilevers 110 and/or can function as a protective layer (e.g., preventing the device from the elements and handling). In a specific example, the insulating film can encompass all or a portion of the barrier film, the set of electrodes 111, and/or the piezoelectric components 114. The material of the insulating film can include silicon oxide and/or any other insulating material. In an example, the thickness of the insulating film (e.g., of a layer of the insulating film) can be between 10 nm-10,000 nm or any range or value therebetween (e.g., 100 nm-1000 nm, approximately 400 nm, etc.). However, the insulating film can be otherwise configured.

The set of cantilevers 110 can optionally include a barrier film, which can function to form a hydrogen barrier. In a specific example, the barrier film can encompass all or a portion of the set of electrodes 111, the piezoelectric components 114, and/or any other cantilever components. The material of the barrier film can include $Al_2O_3$ and/or any other barrier material. In an example, the thickness of the barrier film (e.g., of a layer of the barrier film) can be between 5 nm-1000 nm or any range or value therebetween (e.g., 10 nm-50 nm, approximately 30 nm, etc.). However, the barrier film can be otherwise configured.

A flexible film can optionally be coupled to all or a portion of the surface of the set of cantilevers 110. In variants, this can increase the pressure generated by the transducer 100.

Figure 2C:
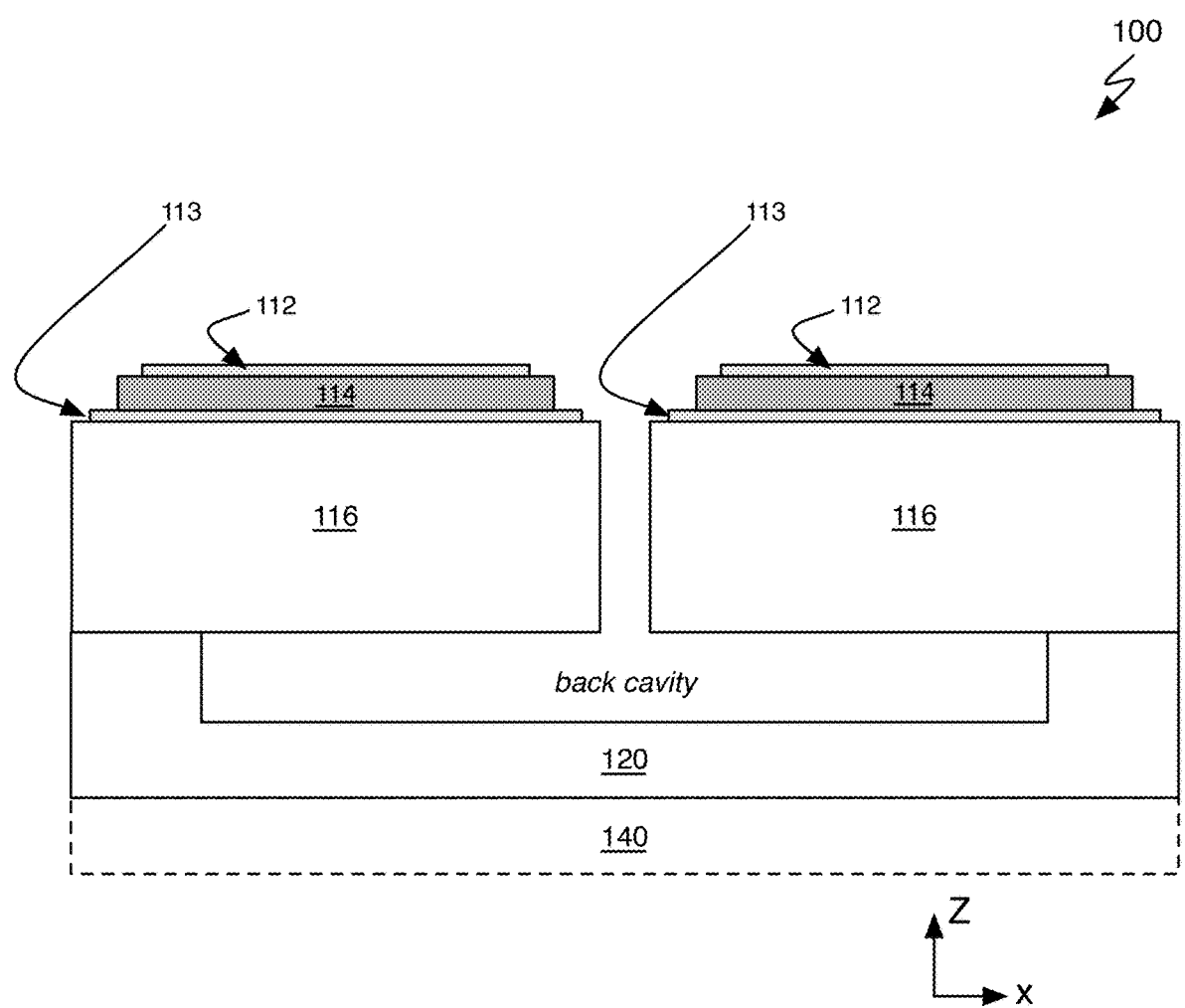
FIG. 2C depicts another example of a transducer with a "closed" back cavity.
Figure 2D:
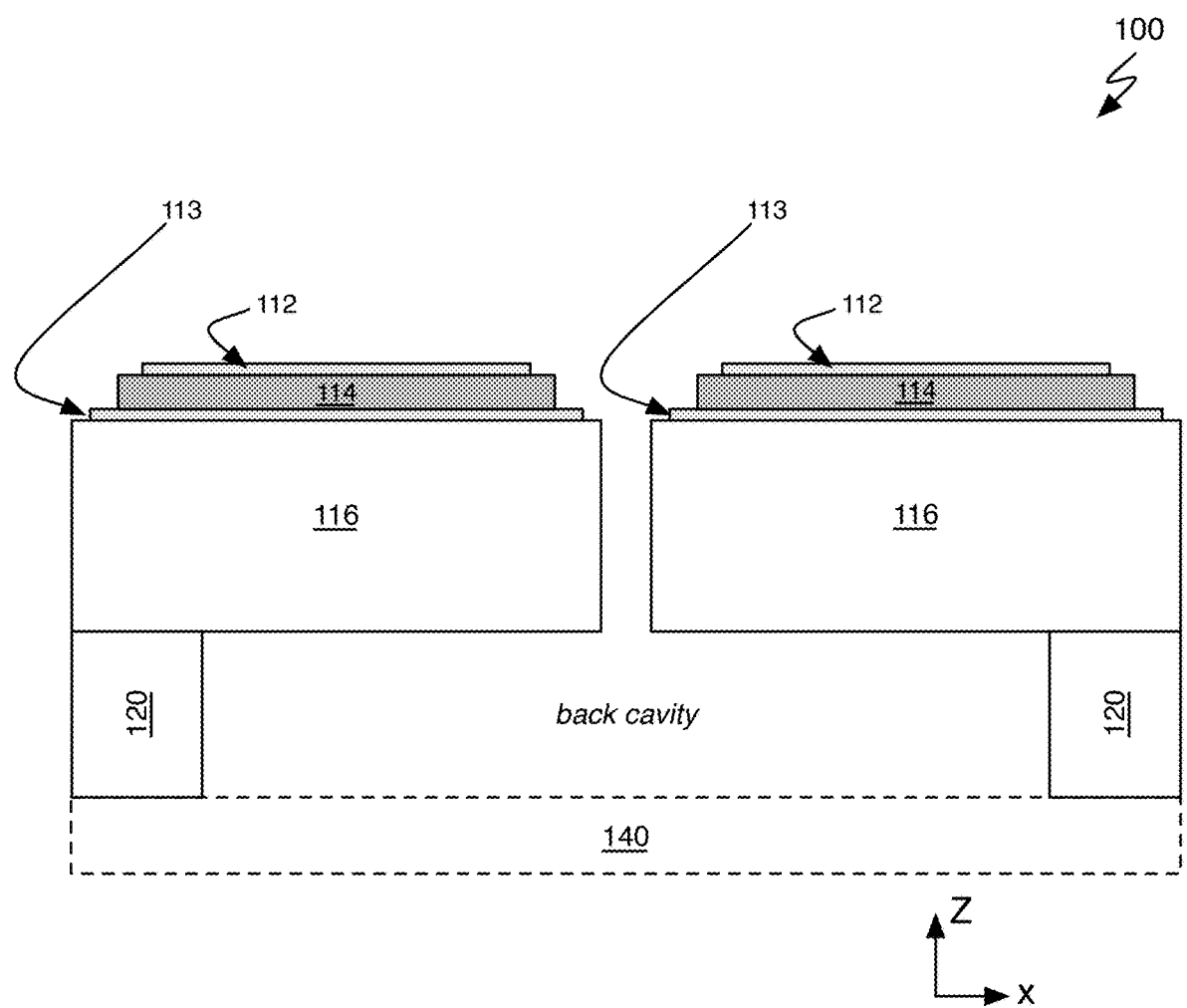
FIG. 2D depicts another example of a transducer with an "open" back cavity.
Figure 4:
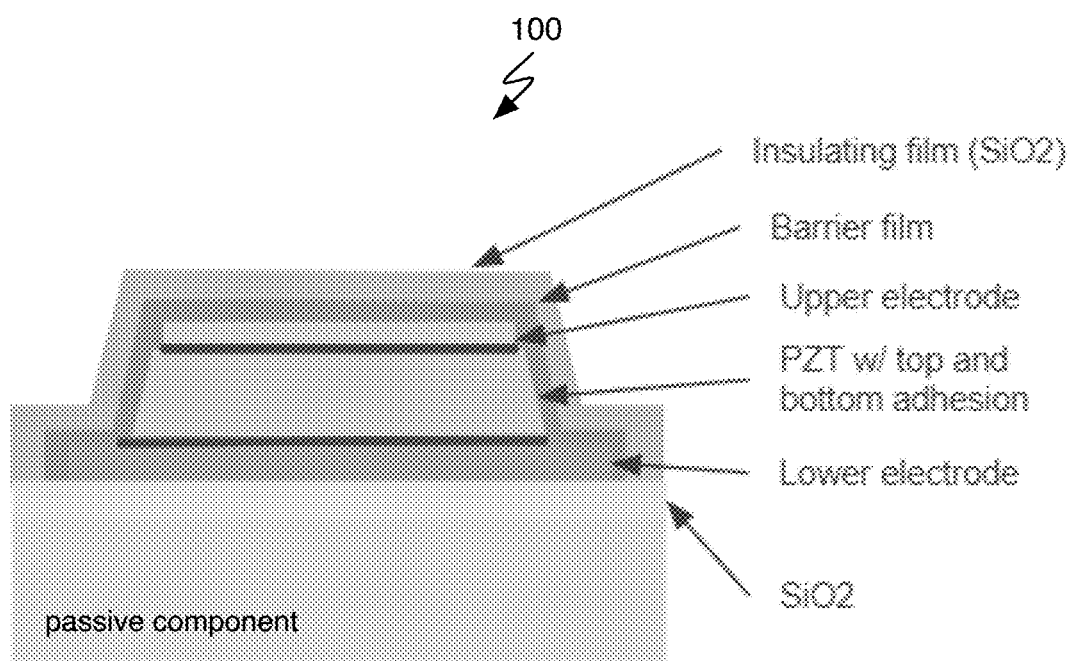
FIG. 4 depicts a specific example of a cross-section of a cantilever.
Figure 5A:
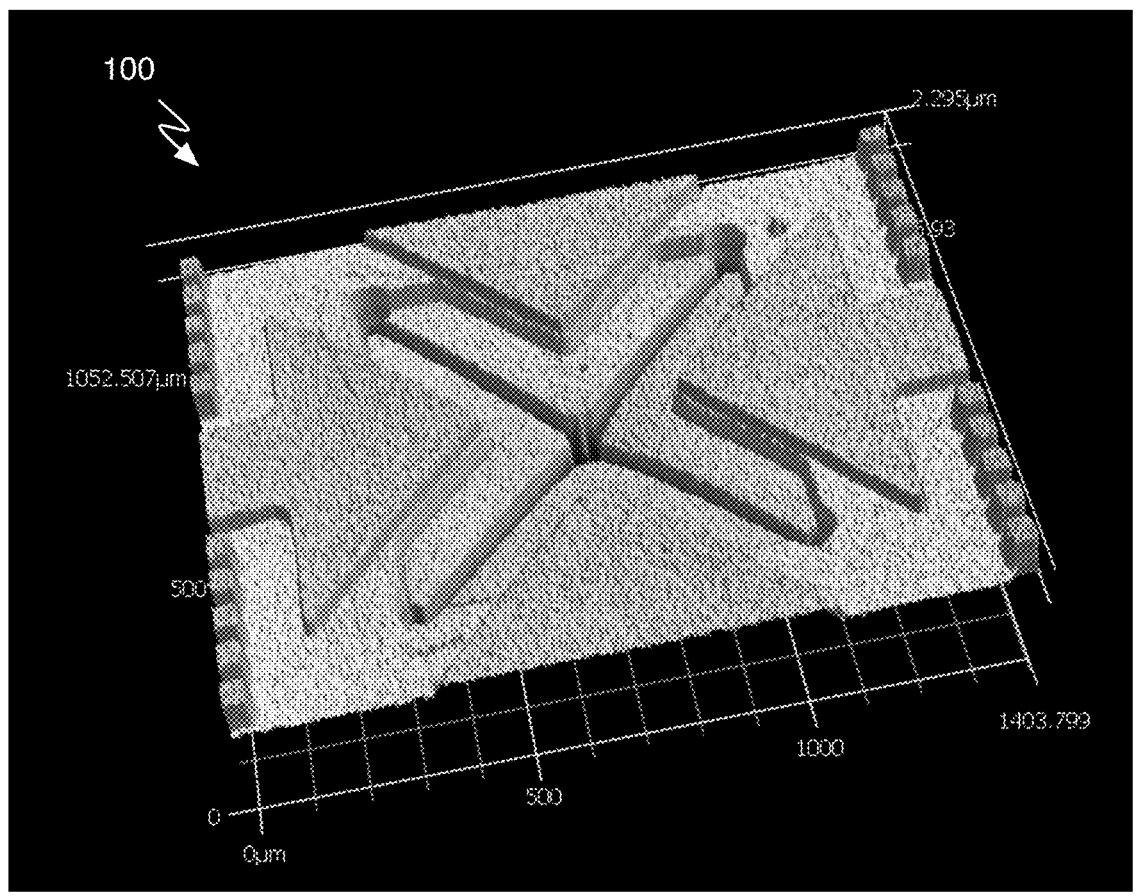
FIG. 5A is a laser 3D microscope image of a specific example of a transducer.
Figure 5B:
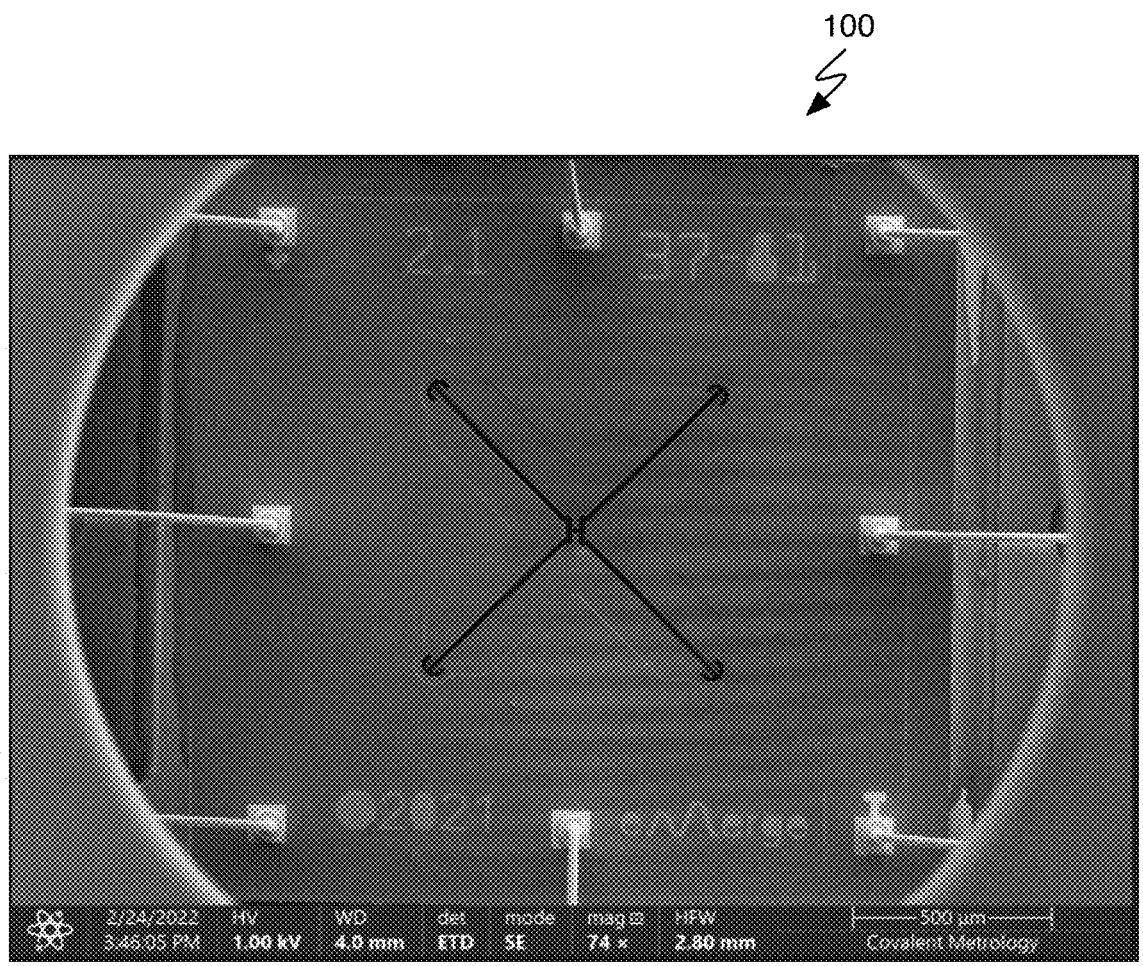
FIG. 5B is an electron microscope image of a specific example of a transducer.
Figure 6A:
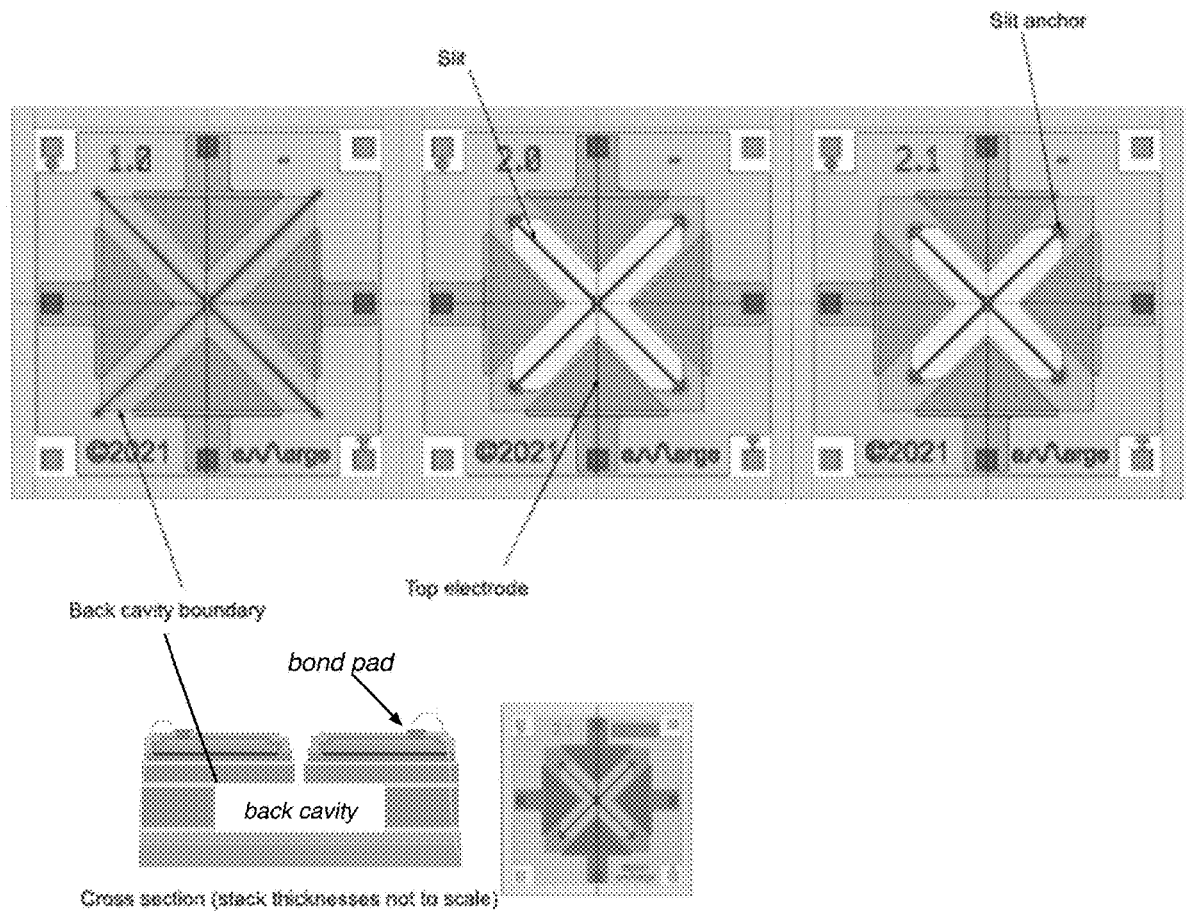
FIG. 6A depicts top view and cross sectional views of MEMS die designs for example transducers with varying slit lengths.
Figure 6B:
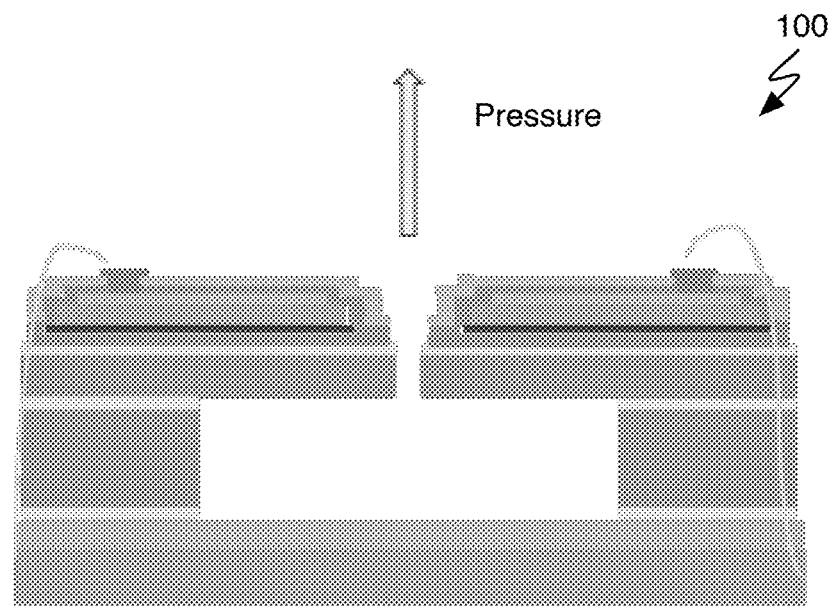
FIGS. 6B and 6C depict cross sectional views of MEMS die designs for example transducers.
Figure 6C:
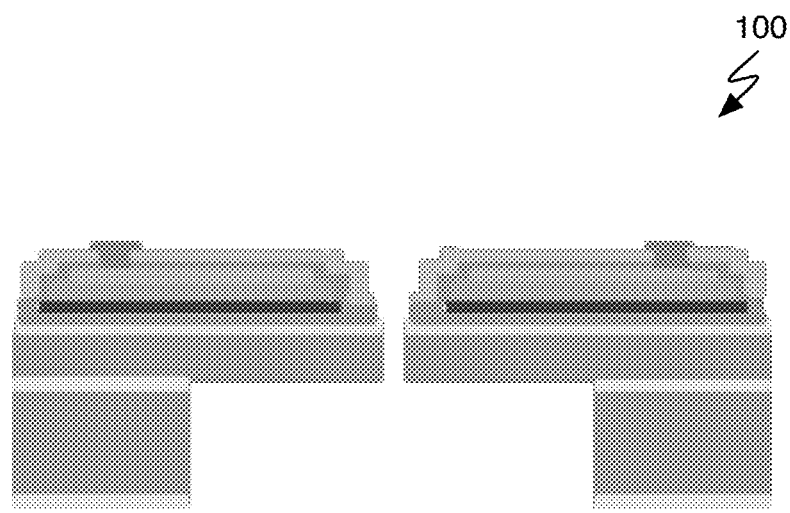
Figure 7:
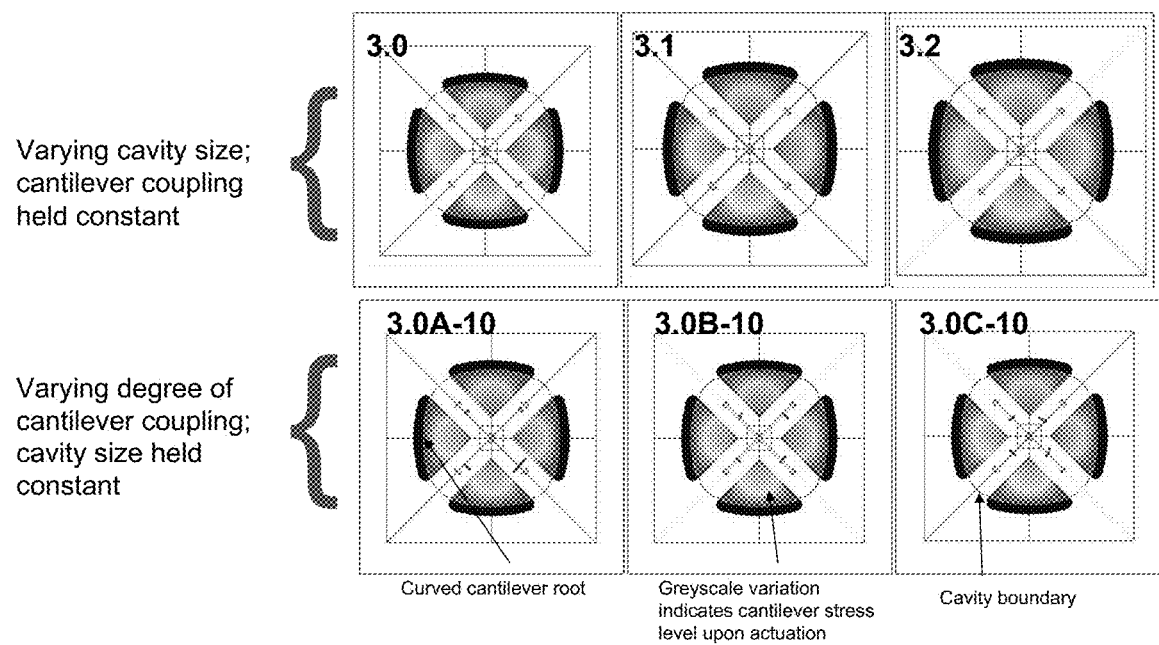
FIG. 7 depicts MEMS die designs for example transducers with varying size (top row) and varying slit length (bottom row). These designs have curved cantilever roots, which reduce bending stress upon actuation.

All or a portion of the transducer 100 can optionally be manufactured from a material stack (e.g., a set of stacked layers of material, stacked in the z-direction). An example is shown in FIG. 4. In a specific example, all or a portion of the transducer 100 (e.g., the set of cantilevers 110) can be manufactured from a piezoelectric thin film stack including: the upper electrode 112 of the set of electrodes 111, the piezoelectric component 114, the lower electrode 113 of the set of electrodes 111, the passive component 116, and/or any other layers (e.g., barrier film, insulating film, etc.). The material stack can optionally be deposited using one or more semiconductor processing techniques. All or a portion of the transducer 100 can optionally be manufactured from the material stack using one or more etching processes. In a specific example, the material stack can be etched to form a 'staircase', with lower layers wider than the upper layers (e.g., an example is shown in FIG. 2C and FIG. 2D).

Figure 22:
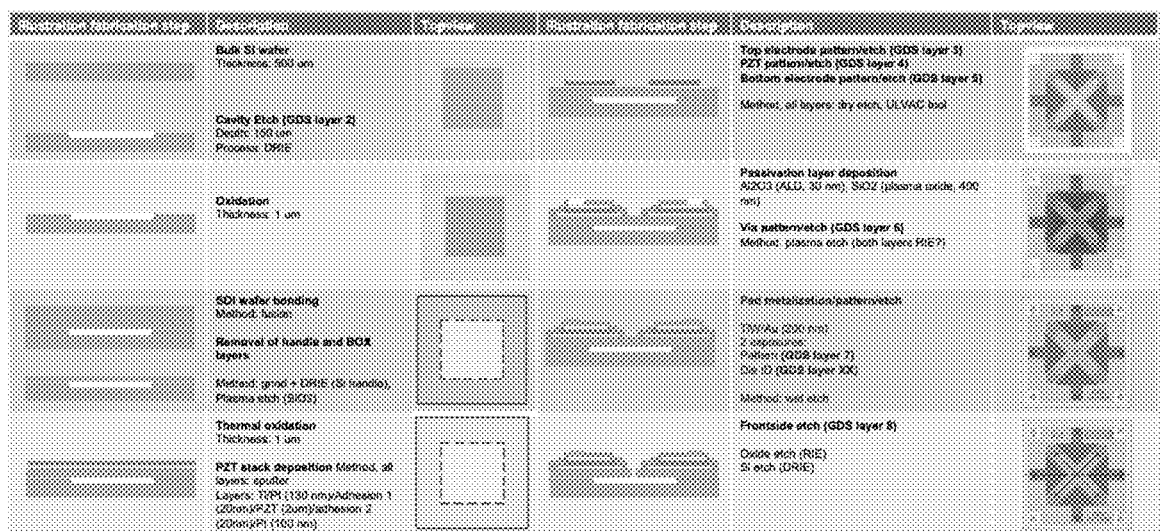
FIG. 22 depicts an illustrative example of manufacturing a transducer.

In an example, manufacturing the set of transducers 100 (e.g., an array of transducers), can include: forming a material stack, the material stack including: a support component 120 (e.g., defining a boundary of a back cavity), a passive component 116 (e.g., defining a roof of the back cavity), a lower electrode 113, a piezoelectric component 114, and an upper electrode 112; and creating a set of slits in the material stack to form a set of cantilevers 110 (e.g., wherein each slit extends along a portion of a diagonal of the roof of the back cavity). In a specific example, manufacturing the transducer 100 can include: etching a bulk silicon wafer to form a cavity wafer (e.g., where the remaining silicon wafer is the set of support components 120 and the cavity is the back cavity), performing oxidation of the top surface of the cavity wafer, bonding a silicon layer to the top surface (e.g., via silicon oxide wafer bonding using a silicon handle, and then removing the handle), performing thermal oxidation, forming the piezoelectric stack (e.g., via deposition) including the set of electrodes 111 and the piezoelectric component 114, etching each layer of the piezoelectric stack (e.g., the upper electrode 112, the piezoelectric component 114, and the lower electrode 113), performing passivation layer deposition, forming one or more bond pads (e.g., via metallization, patterning, and/or etching), and/or performing a frontside etch. An example is shown in FIG. 22.

Figure 3A:
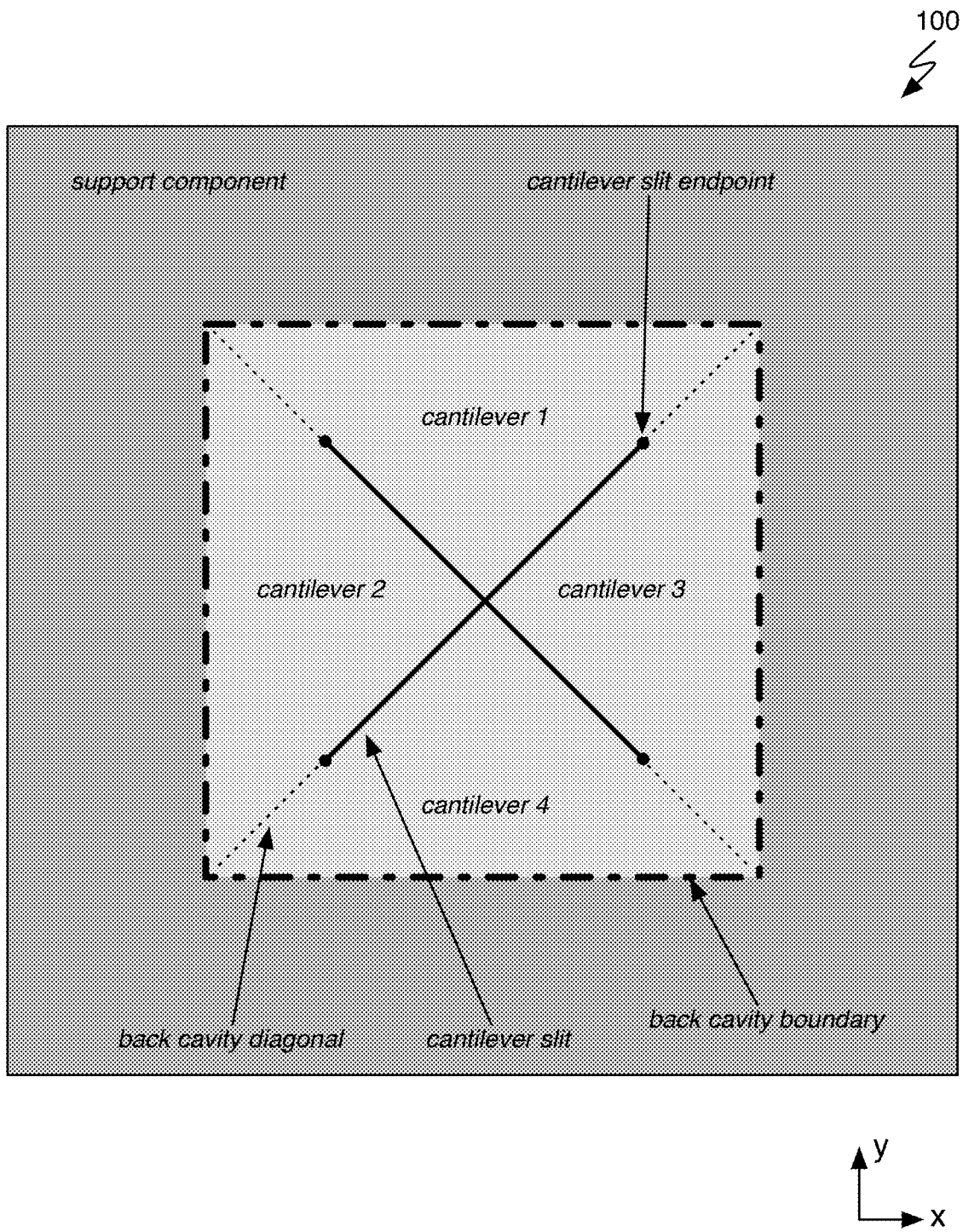
FIG. 3A depicts an example of the transducer with a square back cavity boundary.
Figure 3B:
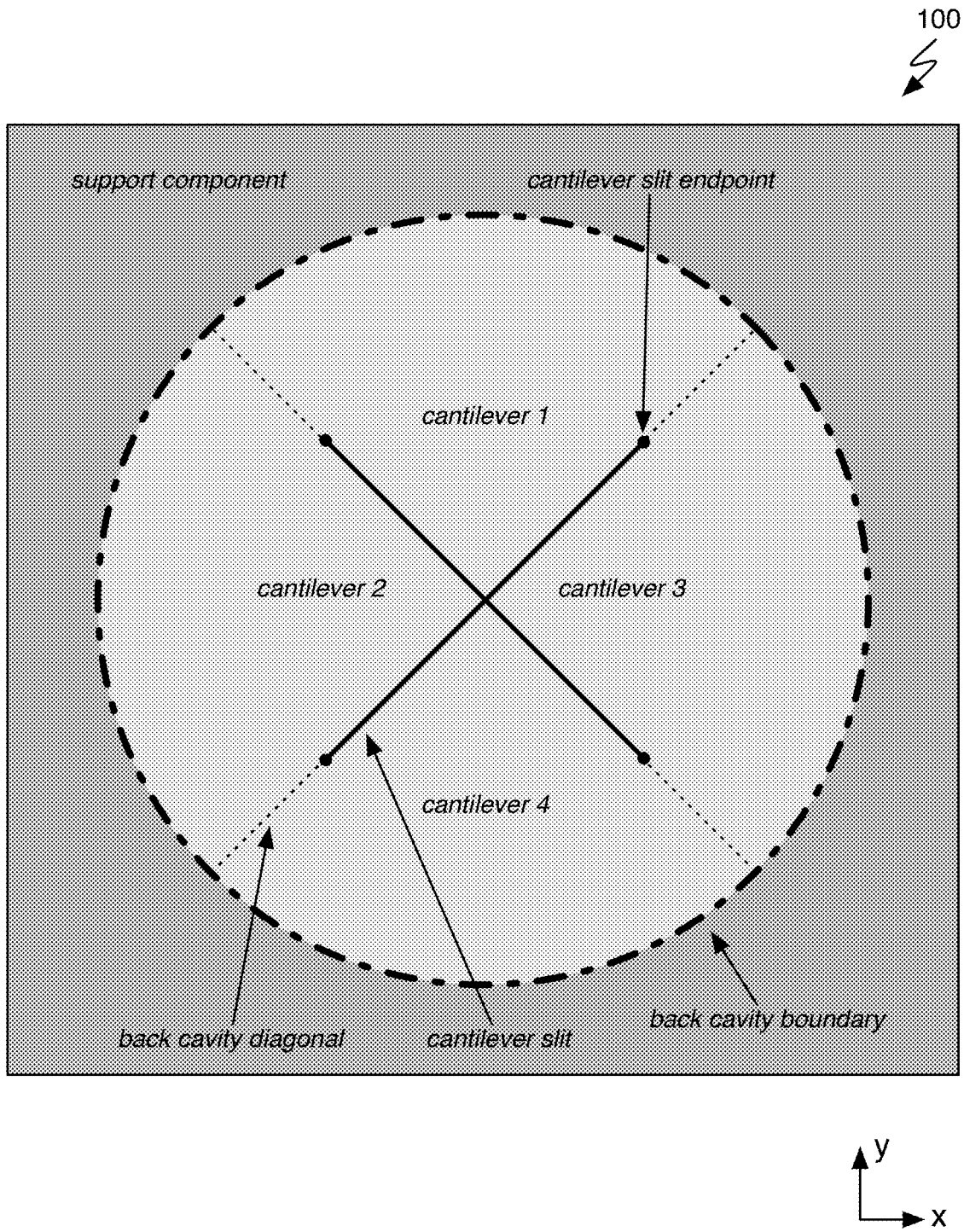
FIG. 3B depicts an example of the transducer with a circular back cavity boundary.
Figure 3C:
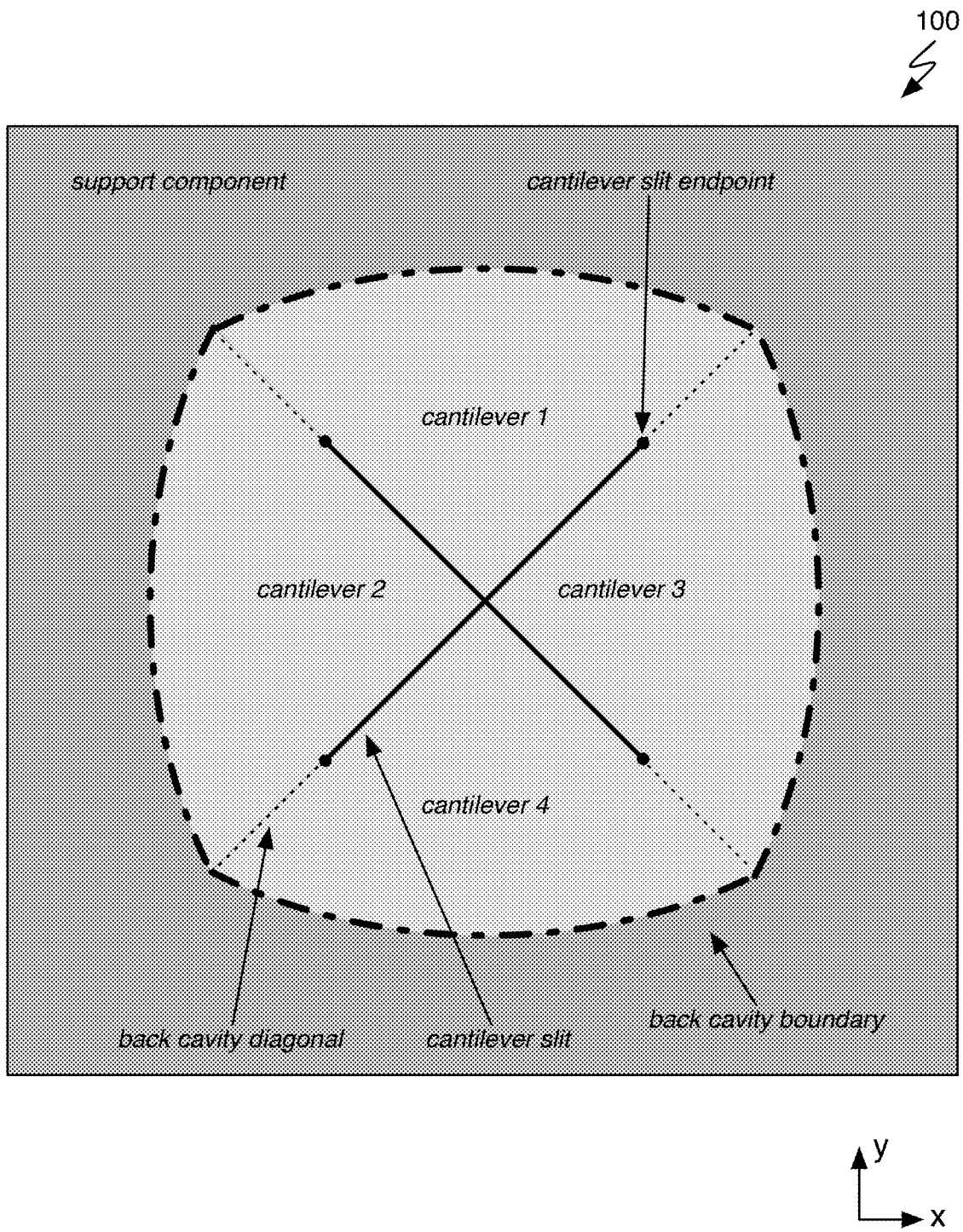
FIG. 3C depicts an example of the transducer with a back cavity boundary defined by four arcs.

For example, the set of cantilevers 110 can be formed by creating one or more slits (e.g., cuts) through the material stack. In a specific example, the material stack can be supported at the boundary (e.g., perimeter, walls, side walls, sides, etc.) of the back cavity via the set of support components 120, wherein the slits partially or fully decouple sections of the material stack to create the set of cantilevers 110. In an example, each slit can partially or fully decouple two adjacent cantilevers in the set of cantilevers 110. The boundary of the back cavity in the xy-plane (e.g., forming the perimeter of the roots of the set of cantilevers 110) can be a square, a rectangle, a circle, an oval, a trapezoid, a rounded rectangle, a rounded trapezoid, a shape defined by three arcs (e.g., where the intersection of each pair of adjacent arcs can optionally be rounded), a shape defined by four arcs (e.g., where each corner where pairs of adjacent arcs meet can optionally be rounded), and/or any other suitable shape. Examples are shown in FIG. 3A, FIG. 3B, and FIG. 3C. In an example, the thickness (e.g., the depth in the z-direction) of the back cavity can be between 50 µm-10 cm or any range or value therebetween (e.g., 100 µm-200 µm, approximately 150 µm, less than 500 µm, less than 200 µm, at least 100 µm, etc.). In a first illustrative example, the back cavity is a "closed" back cavity (e.g., a sealed back cavity), wherein the set of support components 120 form the base (e.g., floor) of the back cavity and the boundary (e.g., perimeter, walls, side walls, sides, etc.) of the back cavity (supporting the set of cantilevers 110); examples are shown in FIG. 2A and FIG. 2C. In a second illustrative example, the back cavity is an "open" back cavity, wherein the set of support components 120 form the sides of the back cavity (supporting the set of cantilevers 110) and can optionally be adhered to a separate frame component 140 (e.g., a printed circuit board connecting multiple transducers 100) that forms the base (e.g., floor) of the back cavity; examples are shown in FIG. 2B and FIG. 2D. In variants, a closed back cavity can optionally increase pressure output by the transducer 100 relative to an open back cavity. In variants, an open back cavity can allow for pressure release around the frame component 140 through small gaps in the adhesive between the support components 120 and the frame component 140.

Figure 11:
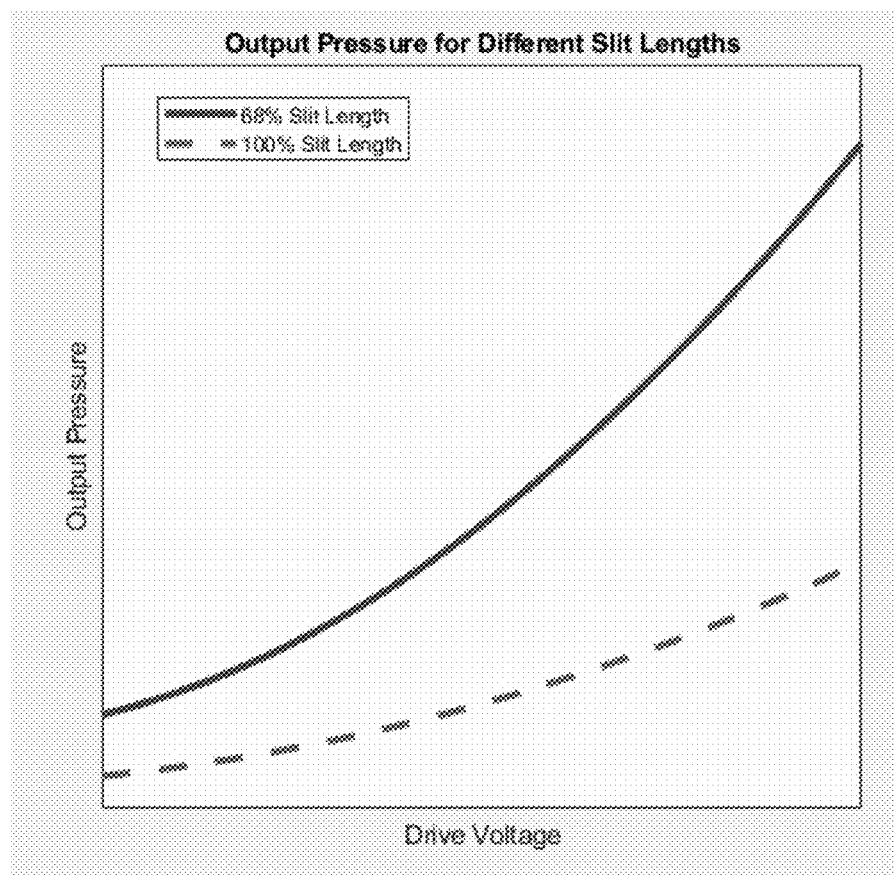
FIG. 11 is a plot of pressure output versus drive voltage for an example transducer with full length slits versus an example transducer with shortened slits.
Figure 12A:
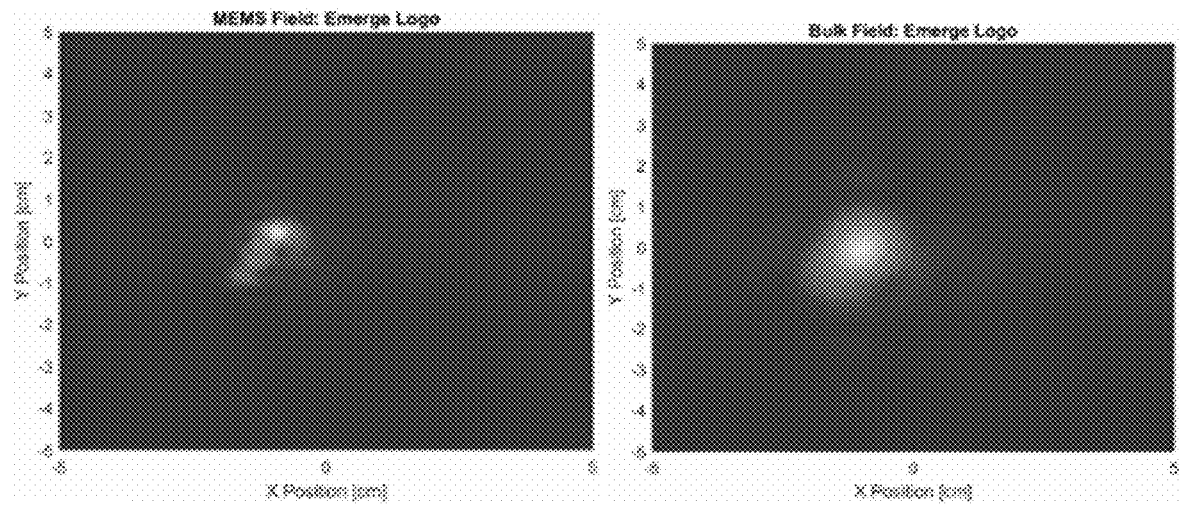
FIGS. 12A-12D depict simulated tactile effects for examples of MEMS transducer (left) and bulk transducer (right) haptic array systems.
Figure 12B:
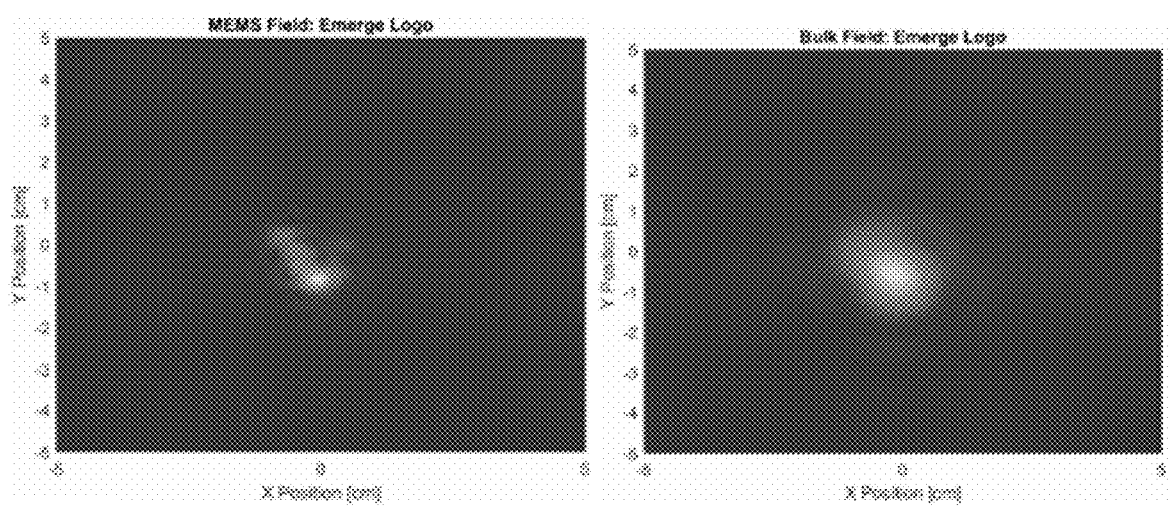
Figure 12C:
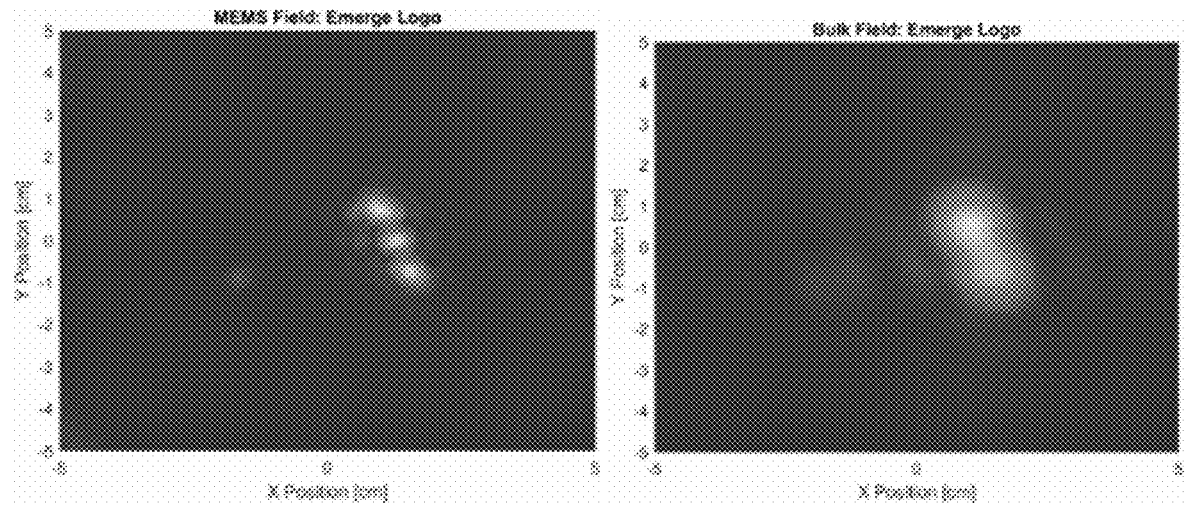
Figure 12D:
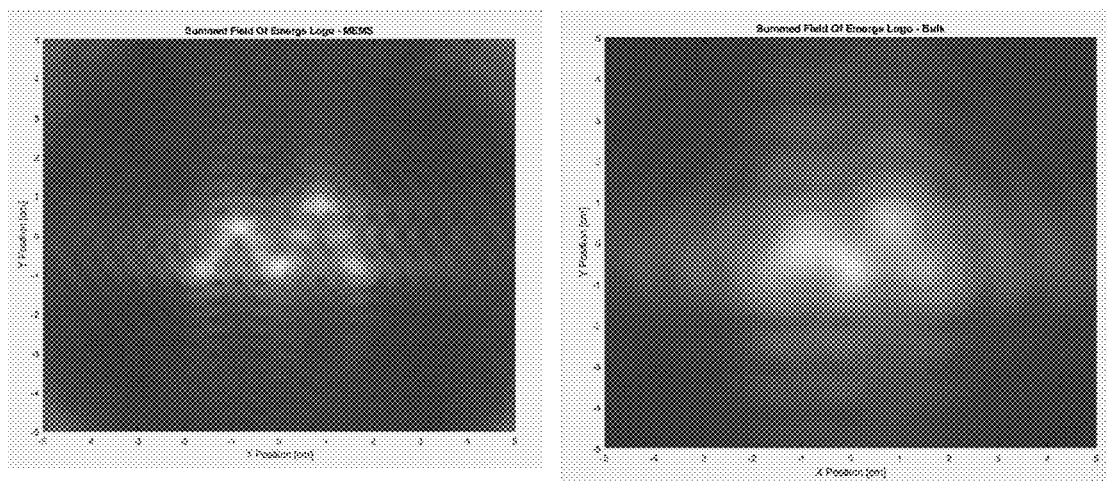
Figure 13:
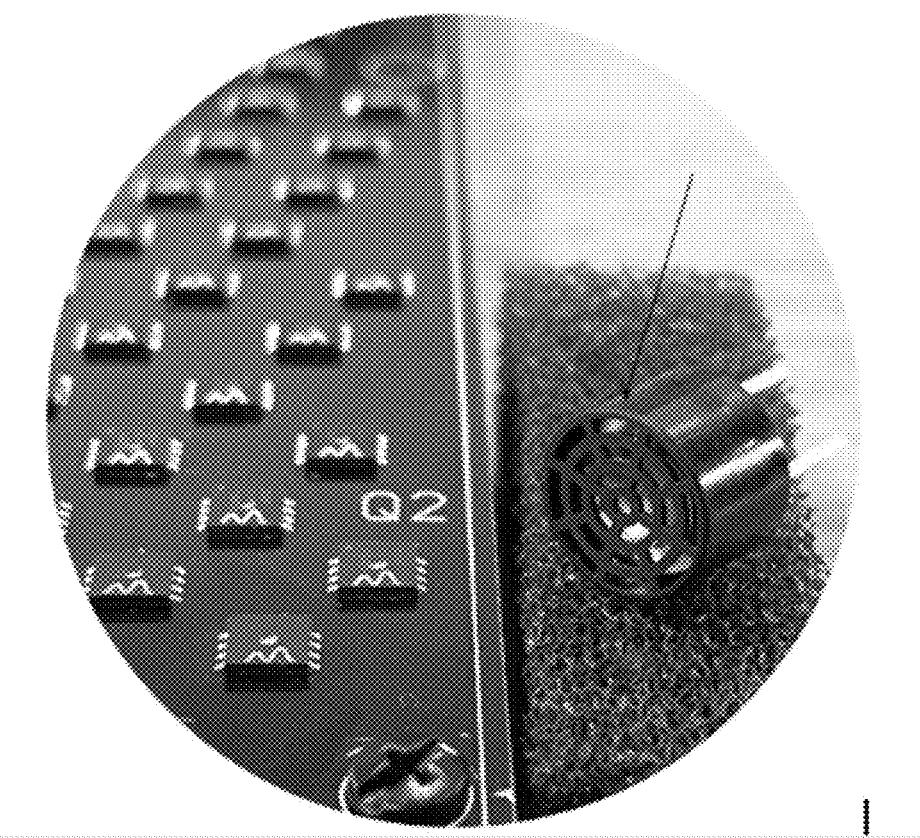
FIG. 13 is a photo of a current state of the art bulk transducer (right) and a photo of an example MEMS ultrasound emitter (mounted on PCB) left.
Figures 21A, 21B, 21C:
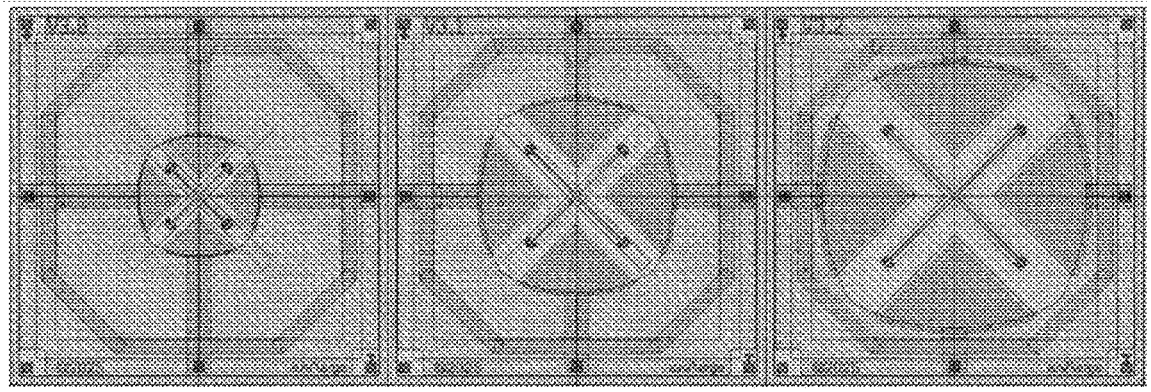
FIGS. 21A-21K depict top views of illustrative examples of transducers.
Figures 21D, 21E, 21F:
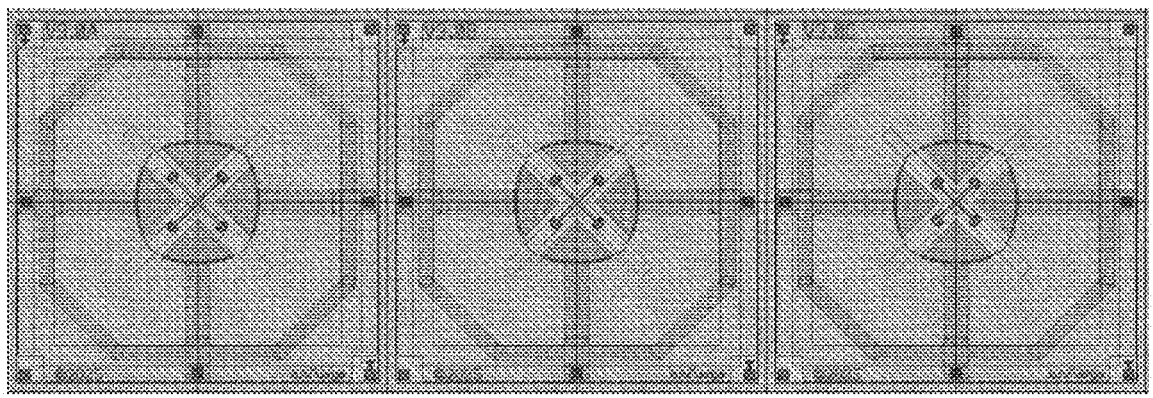
Figures 21G, 21H, 21I:
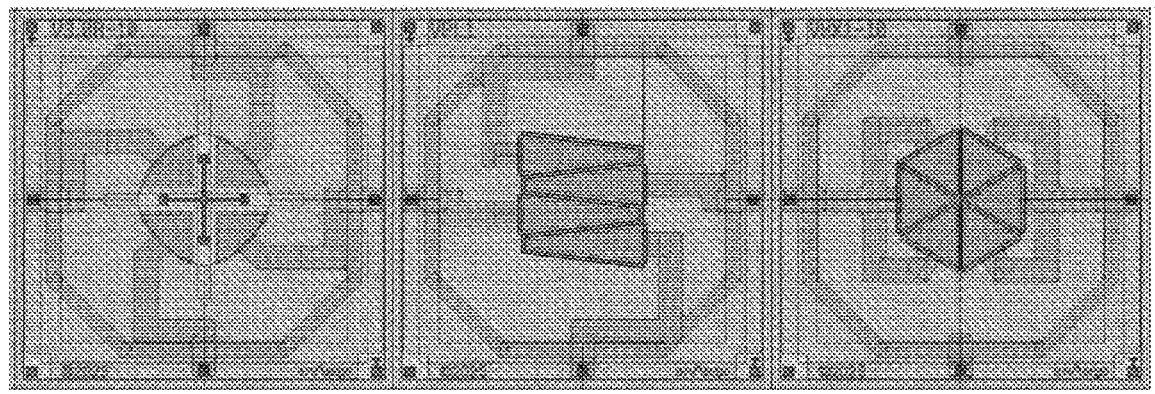
Figures 21J, 21K:
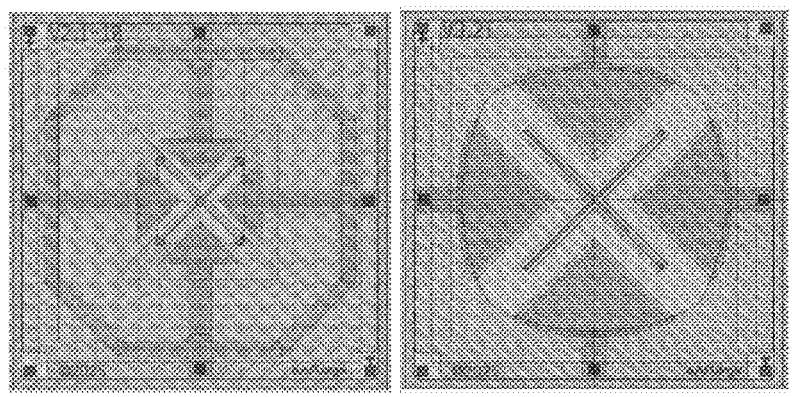

The number of slits can be between 1-100 or any range or value therebetween (e.g., 1, 2, 3, 4, 5, at least 2, 2-5, etc.). The slits can optionally form a continuous opening in the roof of the back cavity (e.g., all slits in a transducer 100 are connected). The set of slits can optionally include two crossing slits (e.g., forming an 'X' shape). The two crossing slits can optionally cross at or near the center of the roof of the back cavity. A slit can extend from between 30%-100% of a length across roof of the back cavity (e.g., the diagonal of a square back cavity, the diameter of a circular back cavity, the diagonal connecting corners of the back cavity, etc.) or any range or value therebetween (e.g., less than 100%, less than 90%, less than 80%, less than 75%, less than 70%, less than 65%, less than 60%, less than 55%, less than 50%, etc.). In a specific example, each slit can extend partially or fully across a diagonal of the back cavity, from one corner of the back cavity to the opposing diagonal corner of the back cavity. In an example, the diagonal connecting two corners (e.g., two opposing corners) of the roof of the back cavity can be between 500 µm-50,000 µm or any range or value therebetween (e.g., 1000 µm-3000 µm, 1000 µm-2000 µm, etc.). In a first variant, the slits extend 100% across the length of the roof of the back cavity (e.g., the full diagonal length of the roof of the back cavity). In a specific example, the set of cantilevers 110 are independent from one another, with approximately no mechanical coupling between them. In a second variant, the slits cross a partial length (less than 100%) of the roof of the back cavity. In a specific example, the set of cantilevers 110 are partially or fully coupled (e.g., the unsupported portion of a first cantilever is connected to the unsupported portion of a second, adjacent cantilever). Partial slits can optionally increase in-phase motion of the set of cantilevers 110, which can increase the overall acoustic power efficiency. Additionally or alternatively, partial slits can create elastic coupling between the set of cantilevers 110, allowing for stronger overall resonance behavior and increased acoustic output. Additionally or alternatively, partial slits can reduce fluid (e.g., air) flow in and out of the back cavity (e.g., resulting in greater pressure output versus drive voltage relative to full length slits). In a specific example, FIGS. 21D-21F show varying slit lengths with a constant back cavity size. Examples of the effects of changing slit length are shown in FIG. 11.

In an example, the length of a slit can be between 100 µm-100 mm or any range or value therebetween (e.g., 500 µm-2000 µm). In an example, the width of a slit can be between 2 nm-1000 nm or any range or value therebetween (e.g., 5 nm-20 nm, approximately 10 nm, etc.). The endpoint of each slit can optionally be rounded. In a first example, the endpoint can be an arc shape (e.g., an anchor shape); an example is shown in FIG. 9A. In a second example, the endpoint can be a teardrop shape; an example is shown in FIG. 9B. In variants, the rounded endpoint can distribute bending stresses at the termination of the slit, which can increase the maximum cantilever motion range. In an example, the radius of the slit endpoint can be between 1 µm-100 µm or any range or value therebetween (e.g., 5 µm-20 µm, approximately 10 µm, etc.).

Figure 8A:
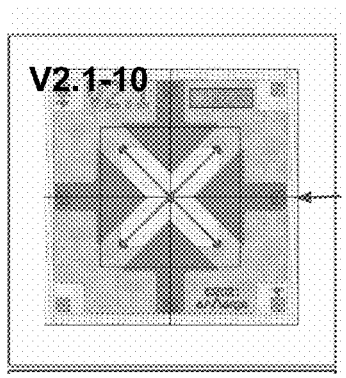
FIG. 8A depicts a MEMS die design for an example transducer.
Figure 8C:
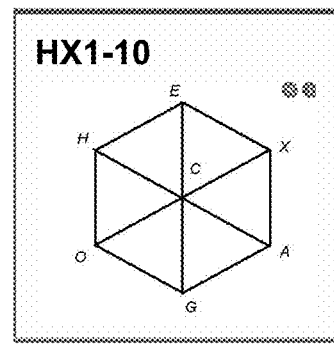
FIG. 8C depicts a MEMS die design for an example transducer with six cantilevers.
Figure 8B:
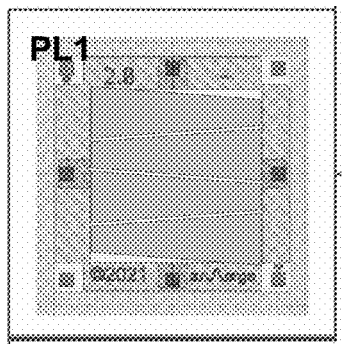
FIG. 8B depicts a MEMS die design for an example transducer with wider tip cantilevers.
Figure 8D:
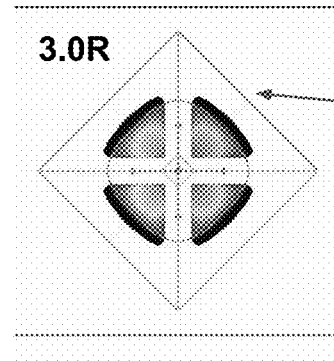
FIG. 8D depicts a MEMS die design for an example transducer with a rotated pattern (e.g., to make use of the opposing silicon crystal plane having a lower modulus).
Figure 10A:
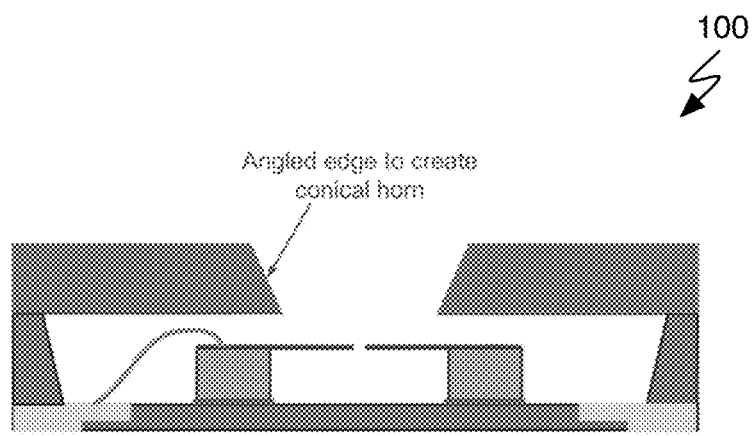
FIGS. 10A-10C depict examples of device packaging, including an opening in the packaging cover acting as a horn.
Figure 10B:
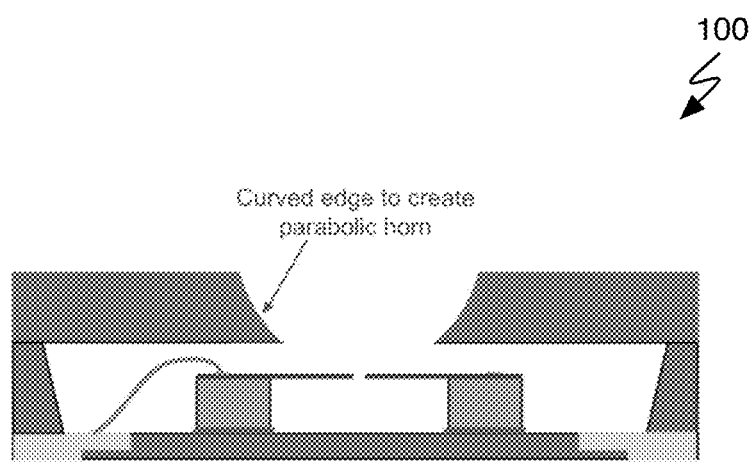
Figure 10C:
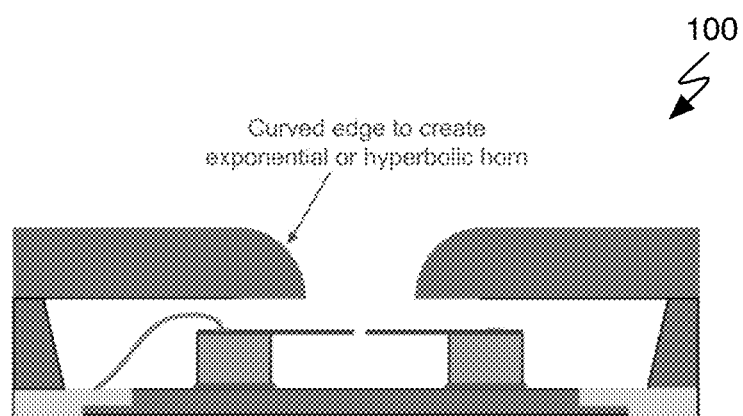

The orientation of one or more components of the set of cantilevers 110 (e.g., the orientation of the slits, in the xy plane) can optionally be determined relative to the crystal plane of the passive component 116. In a first example, the slits can be parallel to an axis of the crystal plane. In a second example, the slits can be at an angle (e.g., approximately 45 degrees) relative to an axis of the crystal plane. In a specific example, the angle can be between 0 degrees-90 degrees or any range or value therebetween (e.g., approximately 45 degrees). For example, the orientation can be rotated 45 degrees to lower the modulus, changing the deflection of the set of cantilevers 110. An example is shown in FIG. 8D.

The (resting state) residual stress of a cantilever can optionally be tuned to determine (e.g., optimize) the range of deflection of the cantilever. For example, the residual stress of the cantilever can be tuned to result in a resting state where the cantilever is deflecting downward (e.g., in the negative z-direction). In this example, the total range of deflection of the cantilever upon actuation can be larger compared to a cantilever with a residual stress that results in a flat or upward-deflection resting state. In variants, this increased deflection range can result in a higher overall pressure output of the associated transducer 100. The residual stress of a cantilever can optionally be tuned by adjusting the material properties and/or the thickness of one or more components of the set of cantilevers 110 (e.g., one or more layers of the material stack).

However, the set of cantilevers 110 can be otherwise configured.

The set of support components 120 can function to support the set of cantilevers 110 and/or form all or a portion of the back cavity of the transducer 100 (e.g., the sides of the back cavity and/or the floor of the back cavity). The set of support components 120 can optionally be connected to (e.g., adhered to) a frame component 140 (e.g., a printed circuit board connecting multiple transducers 100). The material of the set of support components 120 can include silicon and/or any other support material. The set of support components 120 can optionally be connected to a secondary component, which can function to couple the set of support components 120 to the set of cantilevers 110 (e.g., to the passive component 116), insulate the set of support components 120, function as an etch stop during manufacturing, and/or otherwise function. In a specific example, the secondary component can be an oxide (e.g., $SiO_2$).

In an example, the set of support components 120 can extend upwards in the z-direction, supporting one end of the set of cantilevers 110 (e.g., at the root of each cantilever) and enabling the cantilever to bend into and/or out of the back cavity. The set of support components 120 can optionally couple to the root of the set of cantilevers 110 (e.g., to the passive component 116) with a curved geometry. For example, the boundary between the top of the set of support components 120 (e.g., the top of the upper portion of the set of support components 120) and the cantilever root can be curved. In variants, this can more effectively distribute bending stresses (e.g., reducing peak stresses at the root of the cantilever), allowing for higher actuation velocities and acoustic pressure, and reducing crack formation.

However, the set of support components 120 can be otherwise configured.

One or more transducers 100 and/or components thereof can optionally be partially or fully enclosed in one or more packaging components. Examples are shown in FIG. 10A, FIG. 10B, FIG. 10C, FIG. 17, FIG. 18, FIG. 19, and FIG. 20. For example, a set of transducers 100 (e.g., one or more MEMS dies) can be placed in a covered package. Packaging a set of transducers 100 can be performed in one or more stages. In a specific example, packaging a transducer 100 can be performed in two stages: (1) placing the transducer 100 and/or components thereof (e.g., the MEMS die) on a packaging base and (2) installing a packaging cover.

The packaging components can optionally include a packaging base. The packaging base is preferably flat, but can alternatively be any other shape. When the back cavity of the transducer includes an "open" back cavity (e.g., as described above), the MEMS die can optionally be coupled (e.g., sealed) to the packaging base. The packaging base can optionally include one or more bond pads to provide a wire bond from the package to the MEMS die (e.g., connecting the package to the set of electrodes 111). However, bond pads can be otherwise located on the packaging components. The system can optionally include one or more additional bond pads to connect the processing system 200 (e.g., the drive electronics) to the package components.

The package can optionally include a packaging cover positioned above the transducer 100 (e.g., above the MEMS die). The packaging cover preferably contains an opening, but can alternatively not contain an opening. For example, acoustic waves generated by the deflection of the set of cantilevers 110 can travel through the opening. In a first variant, the opening can be a straight hole (e.g., example shown in FIG. 18). In a second variant, the opening can be an angled hole (e.g., example shown in FIG. 19). In an example, the angle of the hole can be between 10 degrees-90 degrees (e.g., wherein 90 degrees is a straight hole, as described in the first variant) or any range or value therebetween. The edge of the hole (e.g., in an xz or yz plane) can be straight (e.g., example shown in FIG. 10A) or curved (e.g., examples shown in FIG. 10B and FIG. 10C). The angled hole can optionally act as a horn (e.g., amplifying the acoustic waves generated by the transducer). In specific examples, the horn can be a parabolic horn, exponential horn, hyperbolic horn, and/or any other type of horn (e.g., as determined based on the opening geometry).

The packaging components can optionally be used to package multiple transducers 100 together. The transducers 100 can optionally be packaged in an array of transducers 100 (e.g., 2×2 array, 3×3 array, etc.). Each transducer 100 in the set of transducers 100 are preferably independently controlled, but can alternatively be controlled together (e.g., via electrical coupling). For example, each transducer 100 can be connected to a set of bond pads in the packaging dedicated to the respective transducer 100. In variants, packaging multiple transducers 100 together can reduce the space between transducers 100, enabling a smaller overall array of transducers 100. The packaging base can optionally be shared across multiple transducers 100. For example, a single packaging base can extend across the array of transducers. The packaging cover can optionally be shared across multiple transducers 100. For example, a single packaging cover can extend across the array of transducers (e.g., with a separate hole for each transducer or with a single hole for multiple transducers).

The system can optionally include a processing system 200, which can function to drive actuation of a cantilever of a transducer 100 by applying a voltage differential to the set of electrodes 111 of the cantilever. The processing system 200 can be connected to the set of electrodes 111 (e.g., via one or more bond pads) and/or connected to any other components. The processing system 200 can optionally modulate the acoustic pressure transmitted by the transducer based on the applied voltage. The processing system 200 can include one or more: CPUs, GPUs, TPUs, custom FPGA/ASICS, microprocessors, servers, cloud computing, and/or any other suitable components. The processing system 200 can be local (e.g., local to one or more transducers 100), remote (e.g., cloud computing server, etc.), distributed, and/or otherwise arranged relative to any other system or module.

In a first variant, for motion at resonance, one or more transducers 100 can be driven with an AC voltage (e.g., purely AC voltage). In a second variant, for motion at resonance, one or more transducers 100 can be driven with a DC bias voltage in addition to an AC voltage. In an example, adding the DC bias voltage can enhance the performance of the device by one or more of: relaxing residual stresses (e.g., allowing for larger deflections, and therefore pressure, before failure), changing the baseline shape of a cantilever, ensuring the cantilever does not deflect inward (into the cavity), preventing depolarization of the piezoelectric component 114 over time, allowing the polarization of the piezoelectric component 114 to remain consistent, and/or providing a more symmetric response to the AC signal. In a specific example, the DC bias can affect the final resonant frequency of the transducer 100 (e.g., the DC bias can optionally be used to tune the resonant frequency).

In an example, the processing system 200 can control one or more transducers 100 according to a set of actuation parameters. In a specific example, the processing system 200 can control each transducer 100 (e.g., independently) in a set of transducers. The set of actuation parameters can define actuation frequency, actuation power (e.g., the strength of the electric field applied to the set of cantilevers 110), actuation pattern over time (e.g., turning on/off transducers over time, changing the actuation power over time, etc.), and/or any other actuation parameters.

In an example, for an individual transducer 100, the processing system 200 can be configured to apply a voltage differential (e.g., a time series of voltage differentials) across the upper electrode 112 and lower electrode 113 of a cantilever in the set of cantilevers 110 of the transducer 100 (e.g., via one or more bond pads), wherein the voltage differential is prescribed by the actuation parameters. In a first specific example, the upper electrodes for each cantilever in the set of cantilevers 110 are electrically connected and the lower electrodes for each cantilever in the set of cantilevers 110 are electrically connected. In this specific example, the voltage differential can be approximately the same for each set of electrodes 111 (e.g., the same across the set of cantilevers 110 in the transducer 100). In a second specific example, the upper electrodes for each cantilever in the set of cantilevers 110 can be electrically separated and/or the lower electrodes for each cantilever in the set of cantilevers 110 can be electrically separated, wherein the actuation parameters prescribe the voltage differential for each set of electrodes 111 in the transducer 100. In this specific example, the voltage differential can be approximately the same for each set of electrodes 111 (e.g., the same across the set of cantilevers 110 in the transducer 100) or different across different sets of electrodes (e.g., across different cantilevers in the transducer 100).

However, the processing system 200 can be otherwise configured.

6. SPECIFIC EXAMPLES

A numbered list of specific examples of the technology described herein are provided below. A person of skill in the art will recognize that the scope of the technology is not limited to and/or by these specific examples.

Specific Example 1. A system, comprising: an array of transducers, wherein each transducer comprises: a set of cantilevers, wherein each cantilever is coupled to an adjacent cantilever in the set of cantilevers along a portion of a side of the cantilever, wherein each cantilever comprises: an upper electrode; a piezoelectric component; a lower electrode; and a passive component; and a processing system configured to, for each cantilever in the set of cantilevers, drive deflection of the cantilever by applying a voltage differential at the upper electrode and the lower electrode of the cantilever.

Specific Example 2. The system of Specific Example 1, wherein, for each cantilever, a length of the portion of the side of the cantilever (e.g., a length of a coupled portion of the side of the cantilever) is at least 10% of a length of the side of the cantilever.

Specific Example 3. The system of any of Specific Examples 1-2, wherein the transducer further comprises a support component coupled to each cantilever of the set of cantilevers at a root of the cantilever.

Specific Example 4. The system of any of Specific Examples 1-3, wherein the set of cantilevers comprises at least four cantilevers.

Specific Example 5. The system of any of Specific Examples 1-4, wherein the upper electrodes of each cantilever are electrically connected, and wherein the lower electrodes of each cantilever are electrically connected.

Specific Example 6. The system of any of Specific Examples 1-5, wherein a width of the lower electrode is greater than a width of the upper electrode.

Specific Example 7. The system of any of Specific Examples 1-6, wherein each cantilever of the set of cantilevers is driven at an ultrasonic frequency.

Specific Example 8. The system of Specific Example 7, wherein each cantilever has a resonance frequency at the ultrasonic frequency.

Specific Example 9. The system of any of Specific Examples 1-8, wherein, for each cantilever, the piezoelectric component does not extend to a tip of the cantilever.

Specific Example 10. The Specific Example of any of Specific Examples 1-9, wherein the array of transducers is configured to provide mid-air haptic stimulation to a user.

Specific Example 11. A method of manufacturing an array of microelectromechanical systems (MEMS) transducers, the method comprising: forming a material stack, the material stack comprising: a support component, the support component defining a boundary of a back cavity; a passive component, the passive component defining a roof of the back cavity; a lower electrode; a piezoelectric component; and an upper electrode; and creating a set of slits in the material stack to form a set of cantilevers, wherein each slit extends along a portion of a diagonal of the roof of the back cavity.

Specific Example 12. The method of Specific Example 11, wherein the portion of the diagonal of the roof of the back cavity comprises less than 75% of a length the diagonal of the roof of the back cavity, wherein the diagonal of the roof of the back cavity extends from a first corner of the roof of the back cavity to a second corner of the roof of the back cavity.

Specific Example 13. The method of any of Specific Examples 11-12, wherein each slit partially decouples two adjacent cantilevers of the set of cantilevers.

Specific Example 14. The method of any of Specific Examples 11-13, wherein the set of slits form a continuous opening in the roof of the back cavity.

Specific Example 15. The method of Specific Example 14, wherein the set of slits comprises two crossing slits, wherein the set of cantilevers comprises four cantilevers.

Specific Example 16. The method of Specific Example 15, wherein the two crossing slits cross at a center of the roof of the back cavity.

Specific Example 17. The method of any of Specific Examples 11-16, wherein a width of each slit in the set of slits is between 5 nm and 20 nm.

Specific Example 18. The method of any of Specific Examples 11-17, further comprising removing a portion of the piezoelectric component adjacent to a boundary of the set of slits.

Specific Example 19. The method of any of Specific Examples 11-18, wherein a shape of the boundary of the back cavity comprises four arcs.

Specific Example 20. The method of any of Specific Examples 11-19, wherein a lower portion of the support component defines a floor of the back cavity.

As used herein, "substantially" or other words of approximation (e.g., "about," "approximately," etc.) can be within a predetermined error threshold or tolerance of a metric, component, or other reference (e.g., within +/−0.001%, +/−0.01%, +/−0.1%, +/−1%, +/−2%, +/−5%, +/−10%, +/−15%, +/−20%, +/−30%, any range or value therein, of a reference).

All references cited herein are incorporated by reference in their entirety, except to the extent that the incorporated material is inconsistent with the express disclosure herein, in which case the language in this disclosure controls.

Different subsystems and/or modules discussed above can be operated and controlled by the same or different entities. In the latter variants, different subsystems can communicate via: APIs (e.g., using API requests and responses, API keys, etc.), requests, and/or other communication channels. Communications between systems can be encrypted (e.g., using symmetric or asymmetric keys), signed, and/or otherwise authenticated or authorized.

Alternative embodiments implement the above methods and/or processing modules in non-transitory computer-readable media, storing computer-readable instructions that, when executed by a processing system, cause the processing system to perform the method(s) discussed herein. The instructions can be executed by computer-executable components integrated with the computer-readable medium and/or processing system. The computer-readable medium may include any suitable computer readable media such as RAMs, ROMs, flash memory, EEPROMs, optical devices (CD or DVD), hard drives, floppy drives, non-transitory computer readable media, or any suitable device. The computer-executable component can include a computing system and/or processing system (e.g., including one or more collocated or distributed, remote or local processors) connected to the non-transitory computer-readable medium, such as CPUs, GPUs, TPUS, microprocessors, or ASICs, but the instructions can alternatively or additionally be executed by any suitable dedicated hardware device.

Embodiments of the system and/or method can include every combination and permutation of the various system components and the various method processes, wherein one or more instances of the method and/or processes described herein can be performed asynchronously (e.g., sequentially), contemporaneously (e.g., concurrently, in parallel, etc.), or in any other suitable order by and/or using one or more instances of the systems, elements, and/or entities described herein. Components and/or processes of the following system and/or method can be used with, in addition to, in lieu of, or otherwise integrated with all or a portion of the systems and/or methods disclosed in the applications mentioned above, each of which are incorporated in their entirety by this reference.

As a person skilled in the art will recognize from the previous detailed description and from the figures and claims, modifications and changes can be made to the preferred embodiments of the invention without departing from the scope of this invention defined in the following claims.

We claim:

1. A system, comprising: an array of transducers, wherein each transducer comprises:
    a set of cantilevers, wherein each cantilever comprises a side comprising a free portion and a coupled portion, wherein each cantilever is coupled to an adjacent cantilever in the set of cantilevers along the coupled portion of the side of the cantilever, wherein each cantilever comprises:
        an upper electrode;
        a piezoelectric component;
        a lower electrode, wherein a distance between a boundary of the lower electrode and the free portion of the side of the cantilever is less than a distance between a boundary of the piezoelectric component and the free portion of the side of the cantilever; and
        a passive component;
    a processing system configured to, for each cantilever in the set of cantilevers, drive deflection of the cantilever by applying a voltage differential at the upper electrode and the lower electrode of the cantilever; and
    a cover comprising an opening, wherein the opening is positioned above the set of cantilevers, wherein an edge of the opening is angled, wherein the opening amplifies acoustic waves generated by the deflection of each cantilever of the set of cantilevers.

2. The system of claim 1, wherein, for each cantilever, a length of the coupled portion of the side of the cantilever is at least 10% of a length of the side of the cantilever.

3. The system of claim 1, wherein the transducer further comprises a support component coupled to each cantilever of the set of cantilevers at a root of the cantilever.

4. The system of claim 1, wherein the set of cantilevers comprises at least four cantilevers.

5. The system of claim 1, wherein the upper electrodes of each cantilever are electrically connected, and wherein the lower electrodes of each cantilever are electrically connected.

6. The system of claim 1, wherein a width of the lower electrode is greater than a width of the upper electrode.

7. The system of claim 1, wherein each cantilever of the set of cantilevers is driven at an ultrasonic frequency.

8. The system of claim 7, wherein each cantilever has a resonance frequency at the ultrasonic frequency.

9. The system of claim 1, wherein the array of transducers is configured to provide mid-air haptic stimulation to a user.

10. The system of claim 1, wherein, for each cantilever, the boundary of the piezoelectric component extends to the coupled portion of the side of the cantilever.

11. The system of claim 1, wherein, for a pair of adjacent cantilevers in the set of cantilevers, a slit separates the free portion of a side of a first cantilever in the pair of adjacent cantilevers from the free portion of a side of a second cantilever in the pair of adjacent cantilevers, wherein an endpoint of the slit is rounded.

12. The system of claim 1, wherein the opening is wider at a top surface of the cover than at a bottom surface of the cover, the bottom surface nearer to the set of cantilevers than the top surface.

* * * * *